(12) United States Patent
Sakata et al.

(10) Patent No.: US 9,734,275 B2
(45) Date of Patent: Aug. 15, 2017

(54) INFORMATION PROCESSING APPARATUS AND DESIGN SUPPORT METHOD

(71) Applicant: FUJITSU LIMITED, Kawasaki-shi, Kanagawa (JP)

(72) Inventors: Toshiyasu Sakata, Hino (JP); Shun Usuba, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 1 day.

(21) Appl. No.: 14/882,920

(22) Filed: Oct. 14, 2015

(65) Prior Publication Data

US 2016/0140277 A1     May 19, 2016

(30) Foreign Application Priority Data

Nov. 13, 2014   (JP) ................................. 2014-230675

(51) Int. Cl.
*G06F 17/50*     (2006.01)
(52) U.S. Cl.
CPC ...... *G06F 17/5068* (2013.01); *G06F 17/5072* (2013.01)
(58) Field of Classification Search
CPC ......... H01L 27/124; H01L 2224/73265; H01L 2924/14; G06F 17/5068; G06F 17/5045; G06F 2217/74; G06F 3/042; G06F 3/04812; G06F 17/5072; G06F 1/1626; G06F 1/1637; G06F 1/1686; G06F 1/1688; G06F 1/16
USPC ................................ 716/100–106, 136–139
See application file for complete search history.

(56) References Cited

U.S. PATENT DOCUMENTS

| | | | | |
|---|---|---|---|---|
| 2008/0308792 A1* | 12/2008 | Takahashi | ............ | G09G 3/3291 257/40 |
| 2012/0305922 A1* | 12/2012 | Yamazaki | ........... | H01L 27/3246 257/59 |
| 2014/0223402 A1* | 8/2014 | Satou | .................. | G06F 17/5068 716/126 |

FOREIGN PATENT DOCUMENTS

| | | |
|---|---|---|
| JP | 2-217967 | 8/1990 |
| JP | 6-301745 | 10/1994 |

OTHER PUBLICATIONS

"A Development Flow of a Printed Circuit Board Having Many Variations", *Design Wave Magazine*, No. 21 (CQ Publishing Co., Ltd), May 1999, pp. 49-50.

* cited by examiner

*Primary Examiner* — Binh Tat
(74) *Attorney, Agent, or Firm* — Staas & Halsey LLP

(57) ABSTRACT

An information processing apparatus includes a storage unit and a processor. The storage unit is configured to store therein plural pieces of shape data indicating shapes of a plurality of components. The plural pieces of shape data are associated with a first window for displaying unarranged components. The processor is configured to generate, using the plural pieces of shape data stored in the storage unit, display information for displaying a shape of a substrate on a screen and for displaying the first window including the shapes of the plurality of components on the displayed substrate. The processor is configured to output the display information.

11 Claims, 31 Drawing Sheets

INFORMATION PROCESSING APPARATUS AND DESIGN SUPPORT METHOD

CROSS-REFERENCE TO RELATED APPLICATION

This application is based upon and claims the benefit of priority from the prior Japanese Patent Application No. 2014-230675, filed on Nov. 13, 2014, the entire contents of which are incorporated herein by reference.

FIELD

The embodiments discussed herein are related to an information processing apparatus and a design support method.

BACKGROUND

In the development of an electronic circuit using a conventional computer-aided design (CAD), an arrangement design is performed in a procedure illustrated in, for example, FIG. 1 after a circuit design.

(1) A designer mainly obtains connection information between terminals of components from a logic diagram 101.

(2) The designer classifies manually the components into several groups on the basis of the connection information between the terminals.

(3) The designer manually arranges the components on a substrate 102 on a group-by-group basis.

(4) The designer moves the components arranged on the substrate 102 again or cancels the arrangement of the components by taking into account various conditions such as wiring property or heat generation.

Since a component arrangement method differs from each designer, the arrangement design may be performed in a different procedure.

A development flow of a printed circuit board having many variations is known. In the development flow, the printed circuit board is developed in the sequence of a circuit design, a printed circuit board design, a printed circuit board manufacturing, a component mounting, and an operation confirmation.

A component arrangement scheme of a printed wiring board designing system is also known. In the component arrangement scheme, connection information of unarranged components are read in a descending order of degrees of connection relationship regarding a designated arranged component, and an outer appearance of an unarranged component and connection relationship between the unarranged component and the designated arranged component are displayed on a display area.

There is also known, for determining an arrangement of pins of a large scale integrated circuit (LSI) for example, an interactive LSI pin floor planner. The LSI pin floor planner displays arrangement states of temporarily determined pins of an LSI to be designed on a first window of a display screen. Further, the LSI pin floor planner displays, on a second window, arrangement states of the LSI to be designed and another LSI or the like on a package and a ratsnet indicating a connection relationship between pins of the LSI to be designed and pins of the other LSI or the like. When an instruction to change the arrangement of the pins of the LSI to be designed, the arrangement states of the pins are changed in the first window as instructed and the ratsnet within the second window is also changed simultaneously.

Related techniques are disclosed in, for example, Japanese Laid-Open Patent Publication No. 02-217967 and Japanese Laid-Open Patent Publication No. 06-301745.

A related technique is also disclosed in a non-patent literature, i.e., "a development flow of a printed circuit board having many variations", Komatsu Shinichi, Design Wave Magazine No. 21 (CQ Publishing Co., Ltd), pp. 49-50, May. 1999.

In an arrangement design using the conventional CAD, in a case where there are many kinds of large number of components which are packed into a substrate at a high density, there is a tendency that a work amount by a designer needed for a component arrangement is increased and working hours are lengthened due to the difficulty of packing the components into the substrate at a high density.

Such a problem is not limited to a case where components are intended to be arranged on a printed circuit board and also occurs in a case where components are intended to be arranged on a semiconductor substrate such as an LSI.

SUMMARY

According to an aspect of the present invention, provided is an information processing apparatus including a storage unit and a processor. The storage unit is configured to store therein plural pieces of shape data indicating shapes of a plurality of components. The plural pieces of shape data are associated with a first window for displaying unarranged components. The processor is configured to generate, using the plural pieces of shape data stored in the storage unit, display information for displaying a shape of a substrate on a screen and for displaying the first window including the shapes of the plurality of components on the displayed substrate. The processor is configured to output the display information.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

Figure 1:
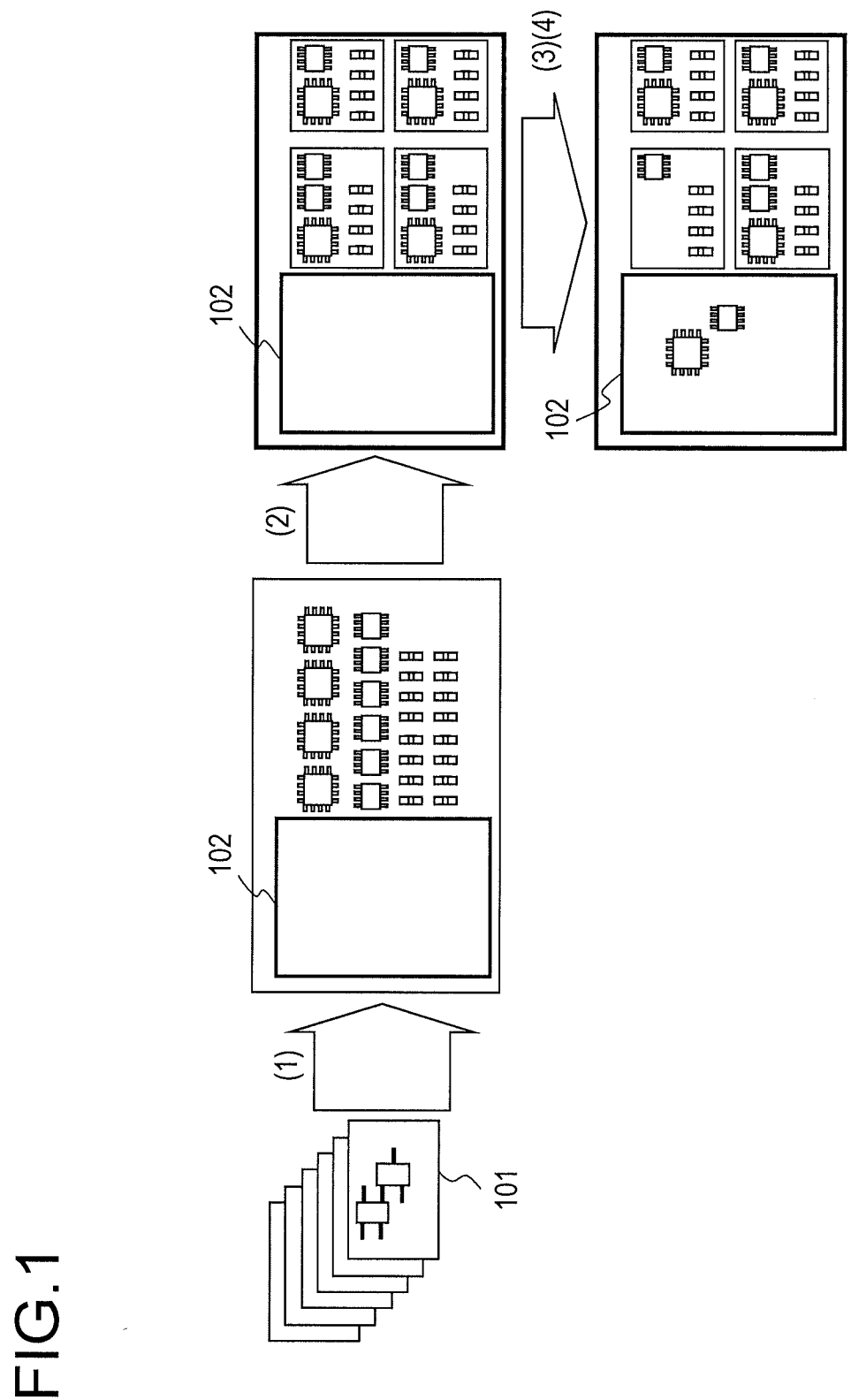
FIG. 1 is a diagram illustrating a conventional arrangement design.
Figure 2:
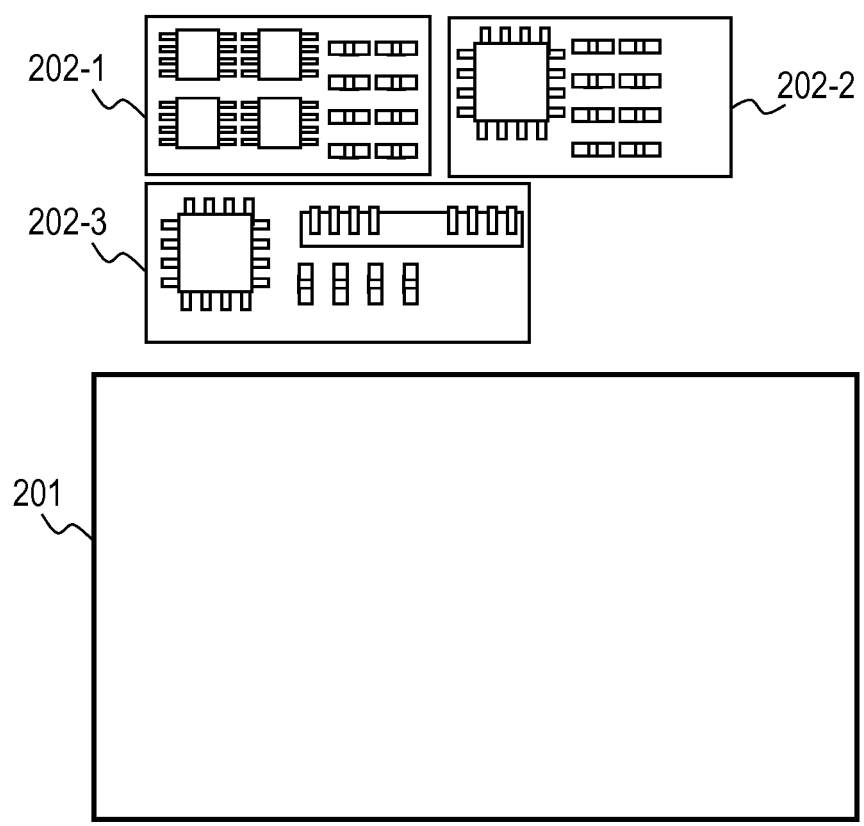
FIG. 2 is a diagram illustrating a classification of components.

Hereinafter, descriptions will be made on embodiments with reference to the accompanying drawings. In a component arrangement in an arrangement design, as illustrated in FIG. 2, unarranged components may be manually collected on an outer periphery of a substrate 201 displayed on a screen of a computer and classified into a group 202-1 to a group 202-3. In this case, an unarranged component may be extracted and positioned with reference to detailed information of a circuit. Further, in a case where the designer performs an arrangement work in a central portion of the substrate 201, since there is a distance between the arrangement position of the component within the substrate 201 and the unarranged components displayed at the outside of the substrate 201, the designer may be frequently switched between the displays such that thinking for examining the component arrangement is hindered.

Figure 3:
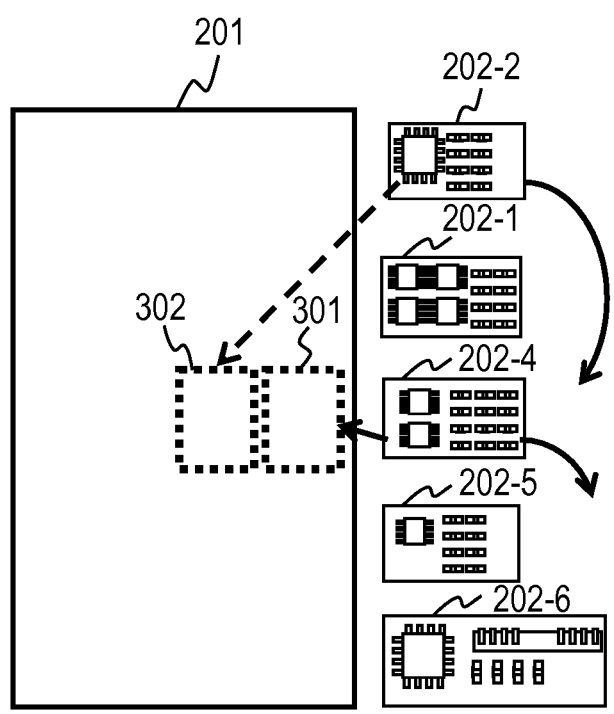
FIG. 3 is a diagram illustrating a relocation of components.

The designer generally arranges the components sequentially one by one on a group-by-group basis on the substrate 201. In this case, as illustrated in FIG. 3, the designer generally performs an arrangement work after relocating the components of a group of interest to a place located at outside of the substrate 201 and closest to the arrangement position.

For example, in a case where a single or a plurality of components of the group 202-2 is arranged at an arrangement position 302 after a single or a plurality of components of the group 202-4 is arranged at an arrangement position 301, the designer relocates the group 202-2 to a place as close as possible to the arrangement position 302. Since the group 202-4 is present in the place closest to the arrangement position 302, the designer relocates the group 202-4 to another place first and then, relocates the group 202-2 to the place where the group 202-4 has been located.

Similarly, a group 202-1, a group 202-5, or a group 202-6 may be relocated to a place other than the place where they are located.

As described above, the work amount is increased since a work of relocating the group of interest to a place close to the arrangement position and a work of securing a relocation destination area for the group of interest are performed. Further, since there is a distance between the arrangement position within the substrate 201 and the group of interest located at outside of the substrate 201, a relocation distance of the components is lengthened and thus operability becomes deteriorated.

When it is intended to arrange a plurality of components of the group 202-2 in the arrangement position 302 while arranging a plurality of components of the group 202-4 in the arrangement position 301, a work of replacing the position of two groups is frequently caused. Therefore, the work amount is increased and an interruption of thinking for arranging the components is caused by the replacement work.

Figure 4:
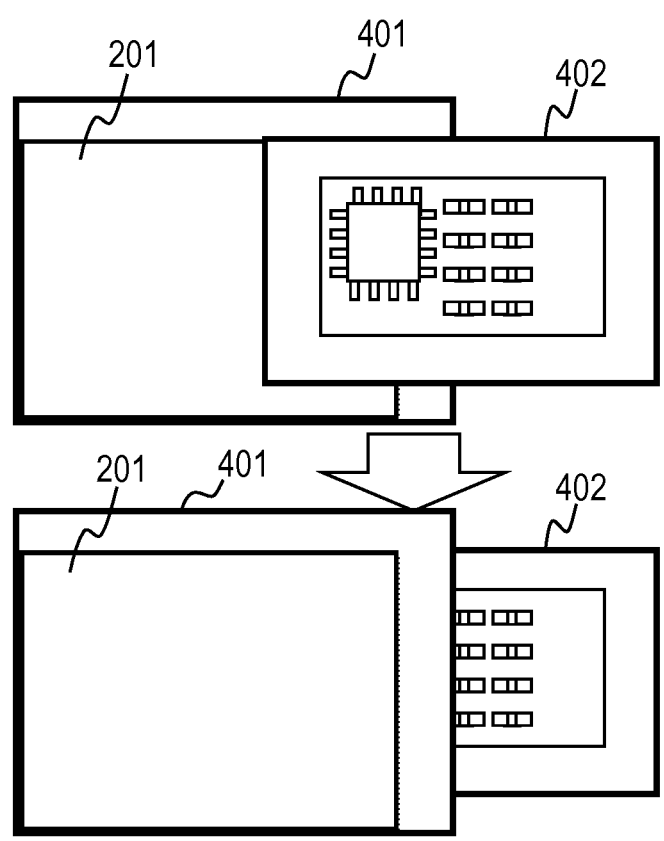
FIG. 4 is a diagram illustrating an arrangement method using a window.

Accordingly, as illustrated in FIG. 4, an arrangement method may be considered in which two windows are displayed on a screen; only the substrate 201 is displayed on a window 401, and only unarranged components are displayed on a window 402. In this arrangement method, the arrangement work is performed by moving a component from the window 402 to the window 401.

In this case, it takes a time for manually adjusting a position and a size of each window. Further, when the window 402 is hidden behind the window 401, unarranged components become in a non-display state and thus readjustment of window may be required.

A method may be considered in which unarranged components are automatically classified by using an attribute such as a shape of component as a key and a list of the unarranged components are displayed for each category, but the unarranged components displayed for each category are not intuitive to perform the arrangement work easily.

Figure 5:
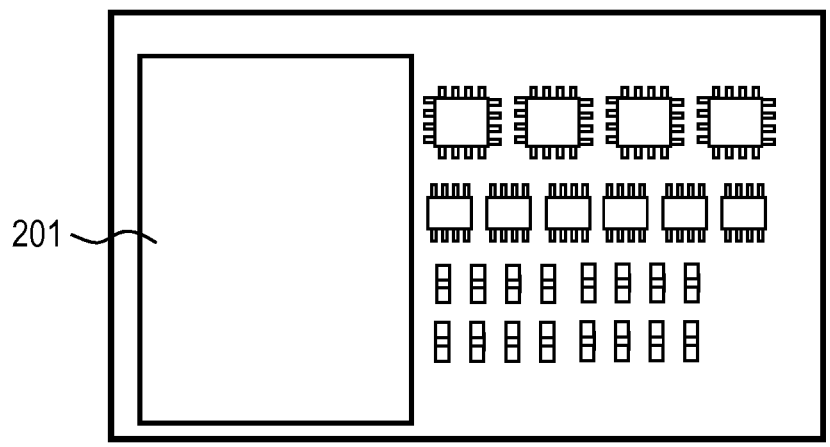
FIG. 5 is a diagram illustrating components displayed on an outer periphery of a substrate.

Accordingly, as illustrated in FIG. 5, a method of displaying automatically classified unarranged components on an outer periphery of the substrate 201 may be considered. However, simply listing the components at an outer periphery of the substrate 201 without a care is not sufficient, and manual reclassification of the components by the designer may be caused and it may take a time for finding out a desired component.

When the component arrangement is reviewed several times by taking into account various conditions such as the wiring property or heat generation, a work efficiency of the designer may be further reduced.

Figure 6:
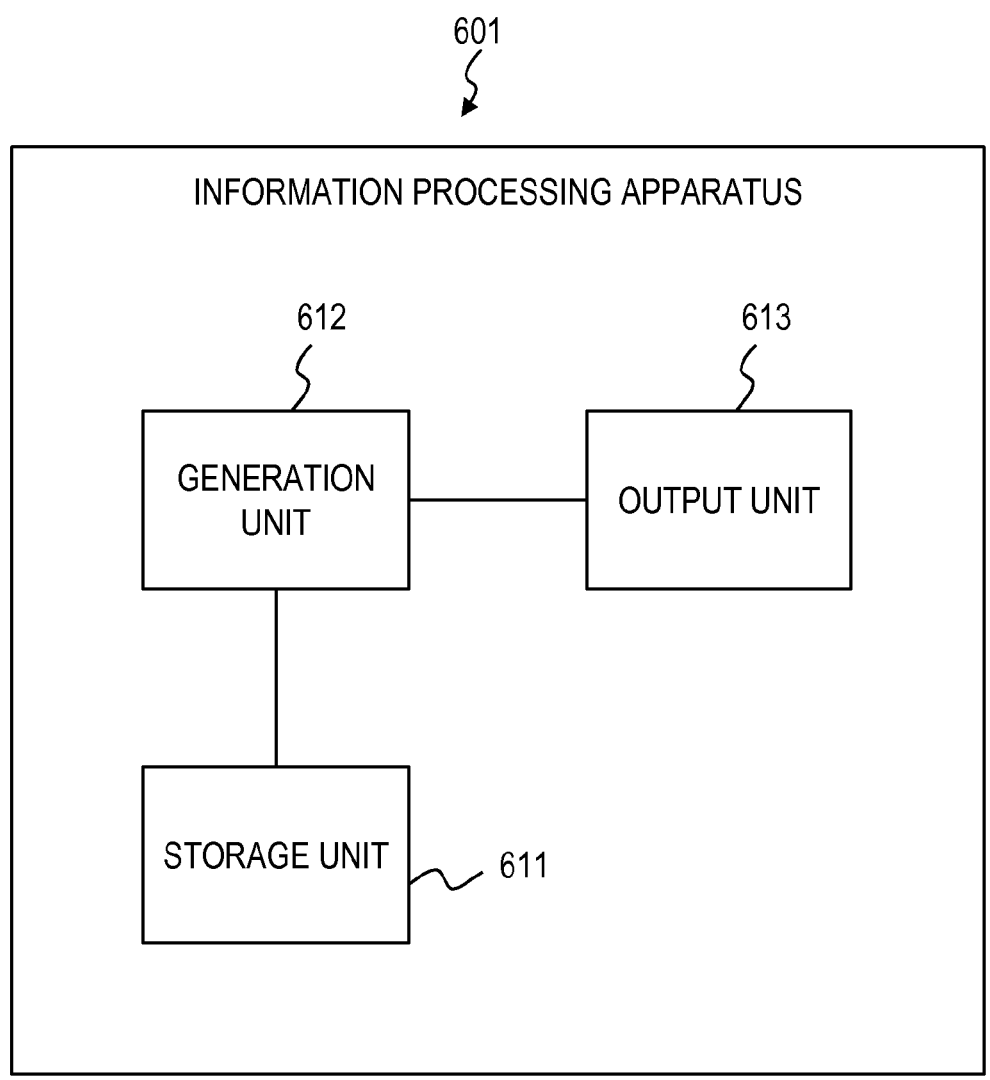
FIG. 6 is a diagram illustrating a functional configuration of an information processing apparatus.

FIG. 6 is a diagram illustrating a functional configuration of an information processing apparatus (computer) according to an embodiment. An information processing apparatus 601 of FIG. 6 includes a storage unit 611, a generation unit 612, and an output unit 613.

The storage unit 611 stores plural pieces of shape data indicating shapes of a plurality of components associated with the window for displaying unarranged components. The generation unit 612 generates display information using the plural pieces of shape data stored in the storage unit 611.

The output unit 613 outputs the display information generated by the generation unit 612.

The output unit 613 is, for example, a display device or a network connection device. When the output unit 613 is a display device, the output unit 613 displays the display information on the screen. When the output unit 613 is a network connection device, the output unit 613 outputs the display information to a communication network. The display information is transmitted to, for example, an information processing apparatus connected to the communication network. The information processing apparatus is able to display the received display information on the screen of a display device.

Figure 7:
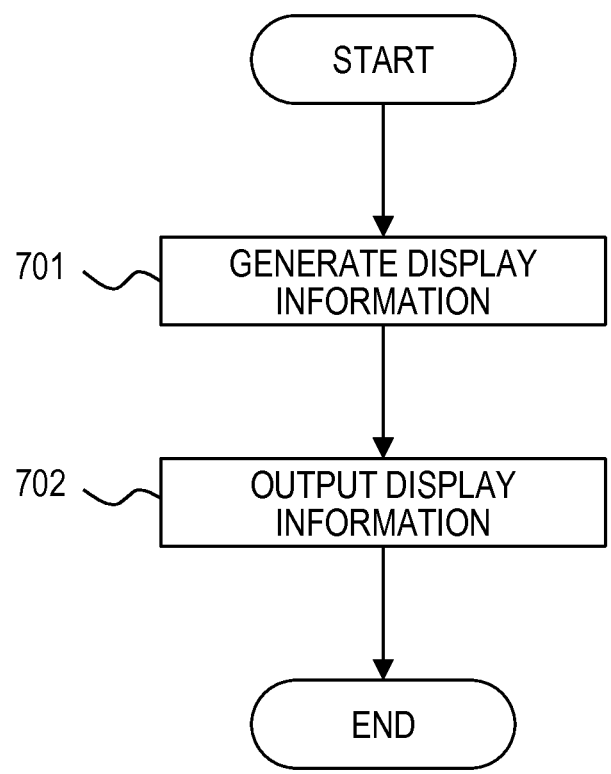
FIG. 7 is a flowchart illustrating a design support processing.

FIG. 7 is a flowchart illustrating an example of a design support processing performed by the information processing apparatus 601 of FIG. 6. The generation unit 612 refers to the storage unit 611 and generates display information using the plural pieces of shape data (701). The display information is display information for displaying a shape of a substrate on a screen and also displays a window containing shapes of plurality of components on the displayed substrate using the plural pieces of shape data. The output unit 613 outputs the display information (702).

According to the information processing apparatus 601 described above, the operability of the arrangement design of arranging the components on the substrate may be improved.

Figure 8:
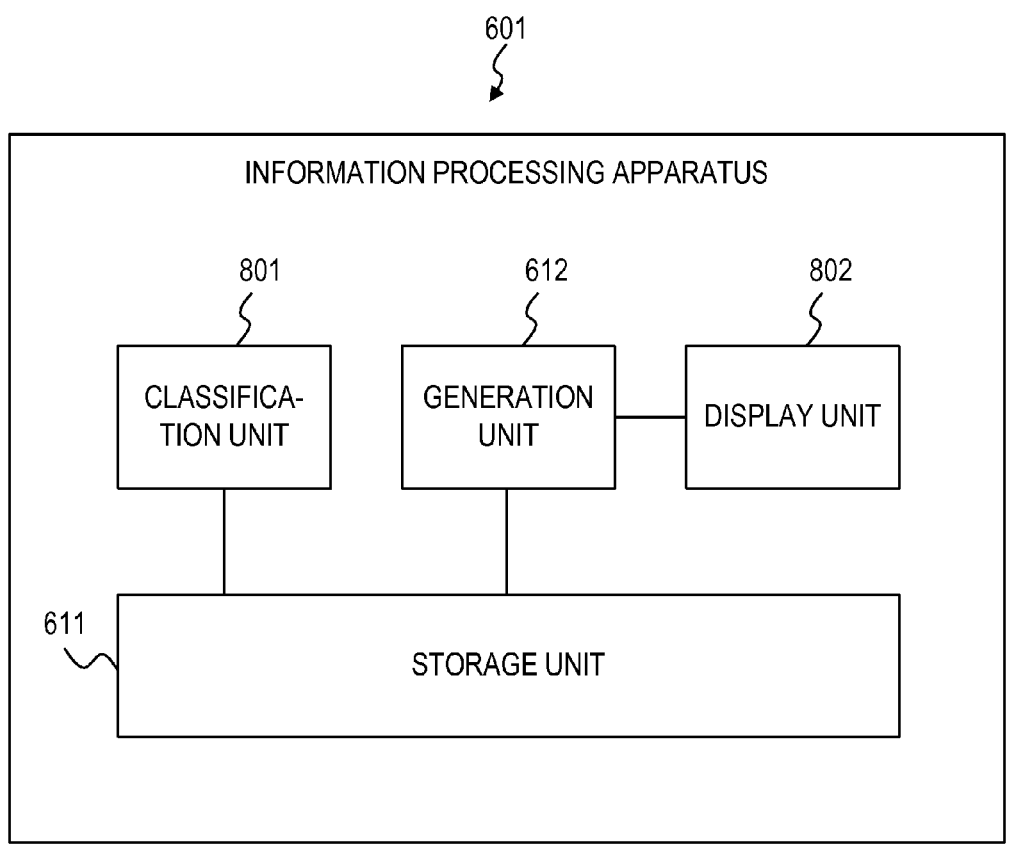
FIG. 8 is a diagram illustrating a specific example of an information processing apparatus.

FIG. 8 is a diagram illustrating a specific example of the information processing apparatus 601 of FIG. 6. An information processing apparatus 601 of FIG. 8 includes a storage unit 611, a generation unit 612, a classification unit 801, and a display unit 802. The storage unit 611 stores CAD data of an electronic circuit and the classification unit 801 classifies unarranged components into a plurality of groups on the basis of the CAD data. The generation unit 612 generates display information on the basis of the CAD data. The display unit 802 corresponds to the output unit 613 of FIG. 6 and displays the display information generated by the generation unit 612 on a screen.

Figure 9:
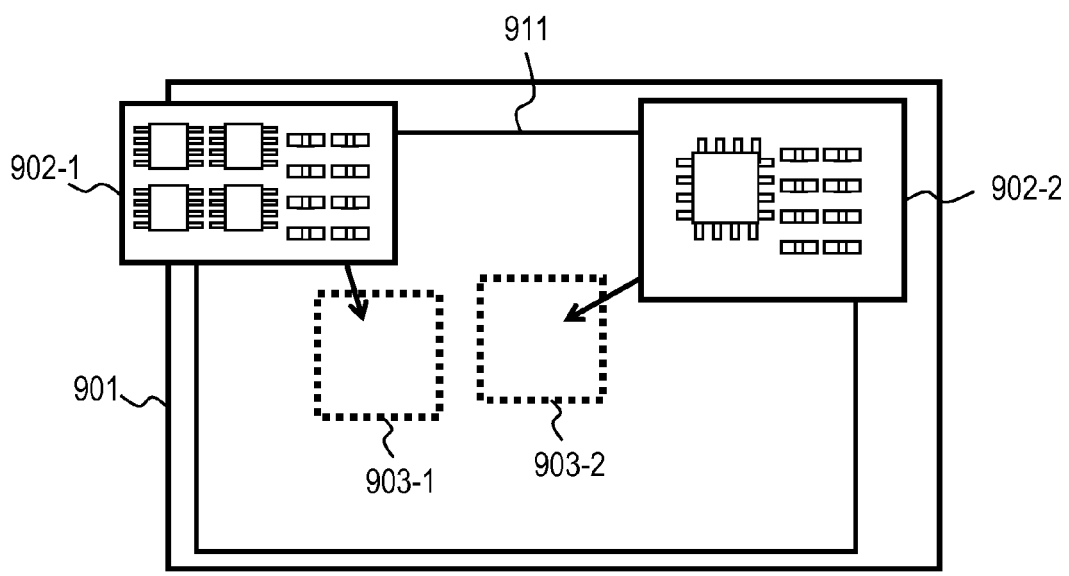
FIG. 9 is a diagram illustrating a window of a substrate and windows of components.

FIG. 9 is a diagram illustrating an example of unarranged components and a substrate displayed on a screen. A shape of a substrate 911 is displayed within a window 901 on the screen, and shapes of components classified into different groups are displayed within a window 902-1 and a window 902-2, respectively. The substrate 911 is, for example, a printed circuit board and the components arranged on the substrate 911 may include, for example, an LSI, an integrated circuit (IC), a resistor, a capacitor, an inductor, and a connector. The window 902-1 and the window 902-2 displayed in front of the window 901 are used for a place (palette) where the unarranged components are temporarily placed.

The window 902-1 is displayed in the vicinity of an arrangement position 903-1 on the substrate 911 and the window 902-2 is displayed in the vicinity of an arrangement position 903-2 on the substrate 911. When an instruction to arrange a component within the window 902-$i$ (i=1, 2) to the arrangement position 903-$i$ is received from an operator such as a designer, the generation unit 612 generates display information in which a shape of the component is deleted from the window 902-$i$ and displayed on the arrangement position 903-$i$.

Further, when an instruction to move a component within the window 902-1 to the window 902-2 is received from an operator, the generation unit 612 generates display information in which a shape of the component is deleted from the window 902-1 and displayed on the window 902-2. As described above, the components may be moved between the palette and the substrate 911 as well as between two palettes.

The operator may perform a manipulation such as enlargement or reduction on an image within the window 902-$i$ and the generation unit 612 may generate display information for displaying wiring elements such as a via or a line, in the window 902-$i$.

Since the window 902-$i$ is displayed in the vicinity of the arrangement position 903-$i$, a distance between the arrangement position 903-$i$ and the unarranged components becomes shorter and it is possible to prevent the thinking about examining the component arrangement from being hindered due to the switching between the displays. Further, since the moving distance of the components becomes shorter and a work of securing the relocation destination area for the group of interest becomes unnecessary, a work is made to be efficient.

In a case where a plurality of components of two groups are arranged at the respective arrangement positions of the two groups, the window of the group of interest is displayed to overlap the front surface of the window of the other group or the window of the other group is closed so as to make it possible to easily switch between the displays. Accordingly, a work of replacing the positions of two groups at the outside of the substrate 911 becomes unnecessary and thus the efficiency of the work is improved and the interruption of thinking about examining the component arrangement is reduced.

Since the window 902-$i$ is always displayed in front of the window 901, the palette is not hindered behind the substrate 911. Further, since the window 902-1 and the window 902-2 may overlap with each other to be displayed on the substrate 911, it becomes unnecessary to adjust the position and the size of the window in order to prevent the groups from being overlapped with each other.

Figure 10:
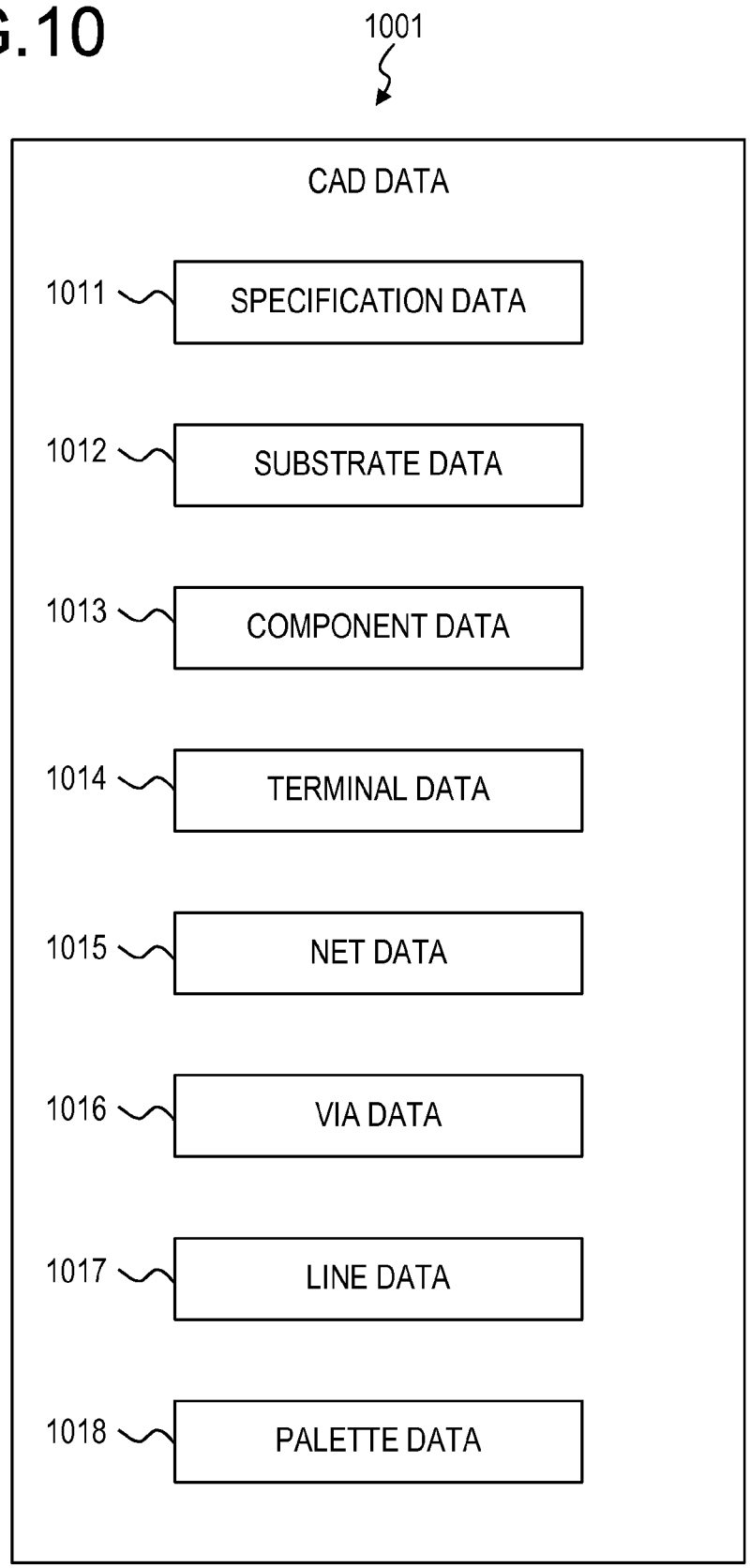
FIG. 10 is a diagram illustrating CAD data.

FIG. 10 is a diagram illustrating an example of CAD data stored in the storage unit 611. CAD data 1001 of FIG. 10 includes specification data 1011, substrate data 1012, component data 1013, terminal data 1014, net data 1015, via data 1016, line data 1017, and palette data 1018.

The specification data 1011 includes a substrate identifier (ID) and a design rule that stipulates, for example, a gap between elements on the substrate. Elements on the substrate may include, for example, a component, a via, and a line. The substrate data 1012 includes shape data indicating a shape of a substrate and layer information indicating a multi-layered structure.

The component data 1013 is generated for each component and includes a component ID, shape data indicating a shape of the component and surface information on which the component is mounted. The component data 1013 further includes arrangement coordinates indicating the position of the component in a substrate coordinate system, a circuit diagram ID of a circuit diagram (logic diagram) to which the component belongs, and a palette ID indicating a palette including the components. In a case where an electronic circuit to be designed is represented by a plurality of circuit diagrams, the circuit diagram ID indicates any one of the plurality of circuit diagrams.

The terminal data 1014 is generated for each terminal (pin) of each component and includes the component ID, a terminal ID, a net ID of a net to which the terminal belongs, coordinates indicating the position of the terminal in the substrate coordinate system. The net data 1015 is generated for each net and includes the net ID and a signal type of the net. The signal type indicates a type of, for example, a signal, a ground, a power supply, and the like. The net data 1015 includes a power supply voltage when the signal type is the power supply.

The arrangement coordinates of the component data 1013 and the coordinates of the terminal data 1014 indicate a position within the window of the palette before the components is arranged on the substrate and indicate a position on the substrate after the component is arranged on the substrate.

The via data 1016 is generated for each via and includes the net ID of the net to which the via belongs, coordinates indicating the position of the via in the substrate coordinate system, and the palette ID indicating the palette including the via. The line data 1017 is generated for each line and includes the net ID of the net to which the line belongs, coordinates indicating the positions of both ends of the line in the substrate coordinate system, a width of the line, a layer ID of a layer to which the line belongs, and the palette ID indicating a palette including the line. A single net includes one or more lines.

The coordinates of the via data 1016 and the line data 1017 indicate a position within the window of the palette before the via and the line are arranged on the substrate and indicate a position on the substrate after the via and the line are arranged on the substrate.

The palette data 1018 is generated for each palette and includes the palette ID, coordinates indicating a position of the window in the substrate coordinate system, a size of the window in the longitudinal and lateral directions, and a comment displayed together with the window.

Figure 11:
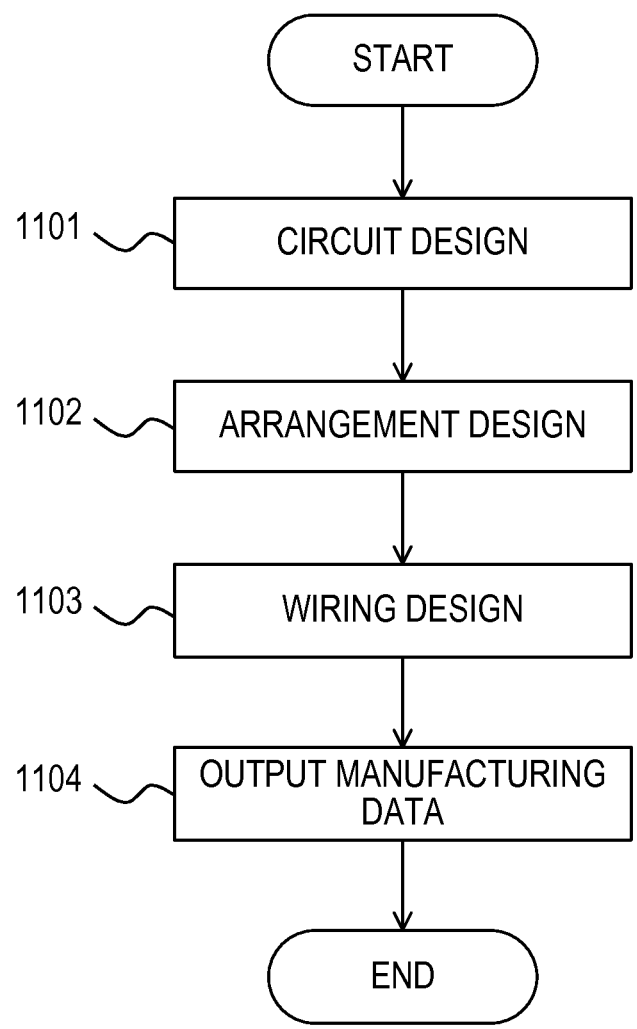
FIG. 11 is a flowchart illustrating a specific example of design support processing.

FIG. 11 is a flowchart illustrating a specific example of the design support processing performed by the information processing apparatus 601 of FIG. 8. First of all, the operator prepares a logic diagram of a circuit by performing a circuit design on the screen and the information processing apparatus 601 generates CAD data corresponding to the logic diagram (1101). Next, the operator performs an arrangement design in which components are arranged on a substrate on the basis of the logic diagram of the circuit and the information processing apparatus 601 updates the CAD data in accordance with instructions from the operator (1102).

Next, the operator performs a wiring design in which vias and lines are arranged on the substrate on the basis of the updated CAD data, and the information processing apparatus 601 further updates the CAD data in accordance with instructions from the operator (1103). The information processing apparatus 601 generates manufacturing data of the circuit on the basis of the further updated CAD data and outputs manufacturing data (1104).

Figure 12:
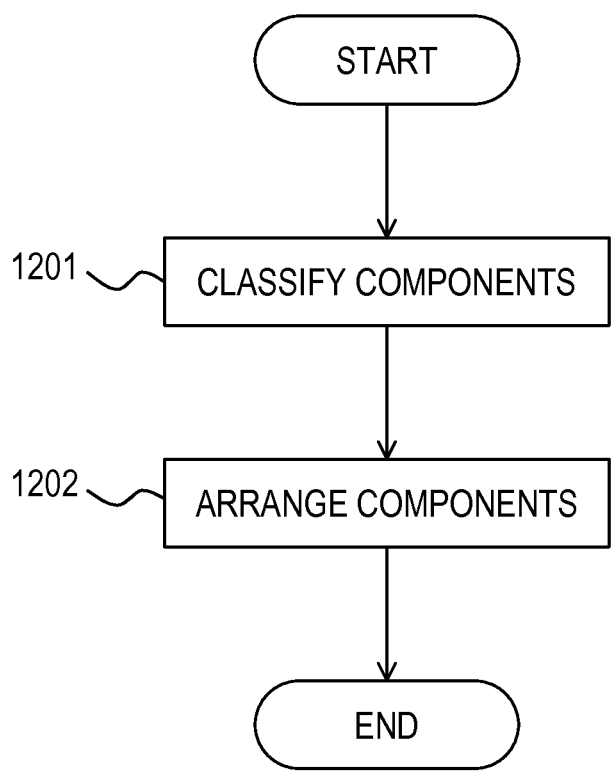
FIG. 12 is a flowchart illustrating an arrangement design.

FIG. 12 is a flowchart illustrating an example of the arrangement design at 1102 of FIG. 11. First of all, the classification unit 801 classifies the components into a plurality of groups on the basis of the CAD data and associates the component data 1013 with the palette data 1018 (1201).

Next, the generation unit 612 generates display information and the display unit 802 displays a window including the shape of the substrate and windows of palettes including the shapes of the components of respective groups on the screen (1202). The operator arranges the components displayed within the window of the palette on the substrate and the generation unit 612 changes the arrangement coordinates included in the component data 1013 and the coordinates included in the terminal data 1014 and also updates the display information in accordance with instructions from the operator. Also, the display unit 802 displays the substrate in which the components are arranged.

The operator arranges the vias and the lines displayed within the window of the palette on the substrate in which the components are arranged at 1103 of FIG. 11. The generation unit 612 changes the coordinates included in the via data 1016 and the line data 1017 and also updates the display information in accordance with instructions from the operator. Also, the display unit 802 displays the substrate in which the components, the vias, and the lines are arranged.

Figure 13:
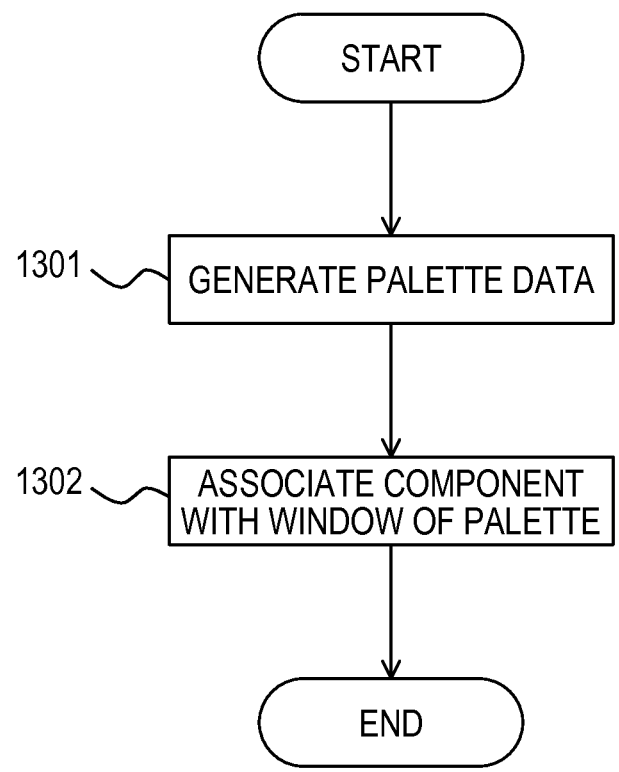
FIG. 13 is a flowchart illustrating a first example of classification processing.

FIG. 13 is a flowchart illustrating a first example of the classification processing at 1201 of FIG. 12. First of all, the classification unit 801 classifies the components into a plurality of groups in accordance with instructions from the operator and generates the palette data 1018 for each group (1301).

Next, the classification unit 801 adds the palette ID of the palette data 1018 to the component data 1013 of each component that belongs to each group so as to associate each component with the window of the palette (1302).

Figure 14:
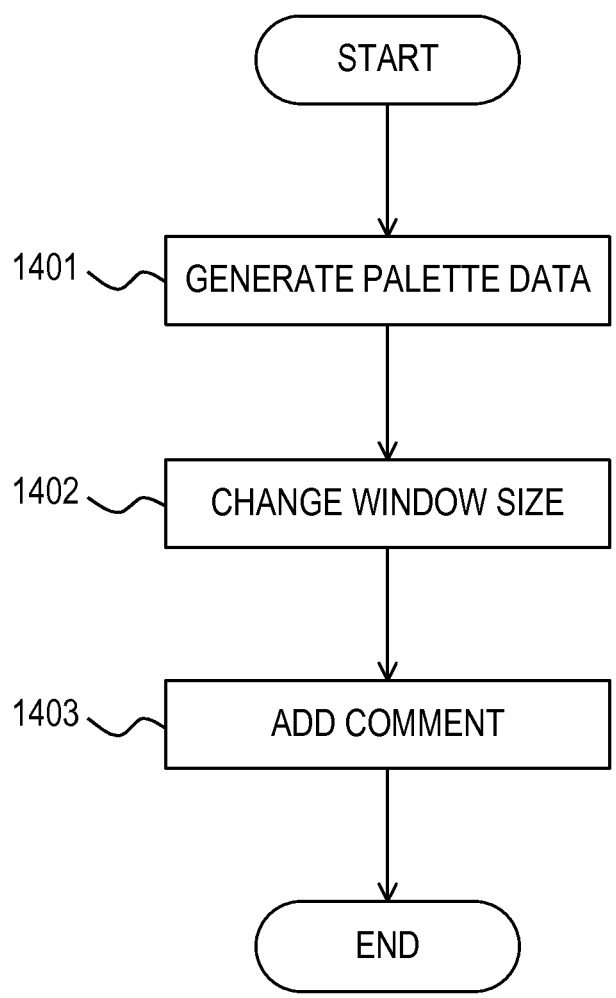
FIG. 14 is a flowchart illustrating a second example of classification processing.

FIG. 14 is a flowchart illustrating a second example of the classification processing at 1201 of FIG. 12. First of all, the classification unit 801 performs the classification processing of FIG. 13 to generate the palette data 1018 (1401). Next, the classification unit 801 performs a window size changing processing for each palette (1402) and performs a comment addition processing for each palette (1403).

Figure 15:
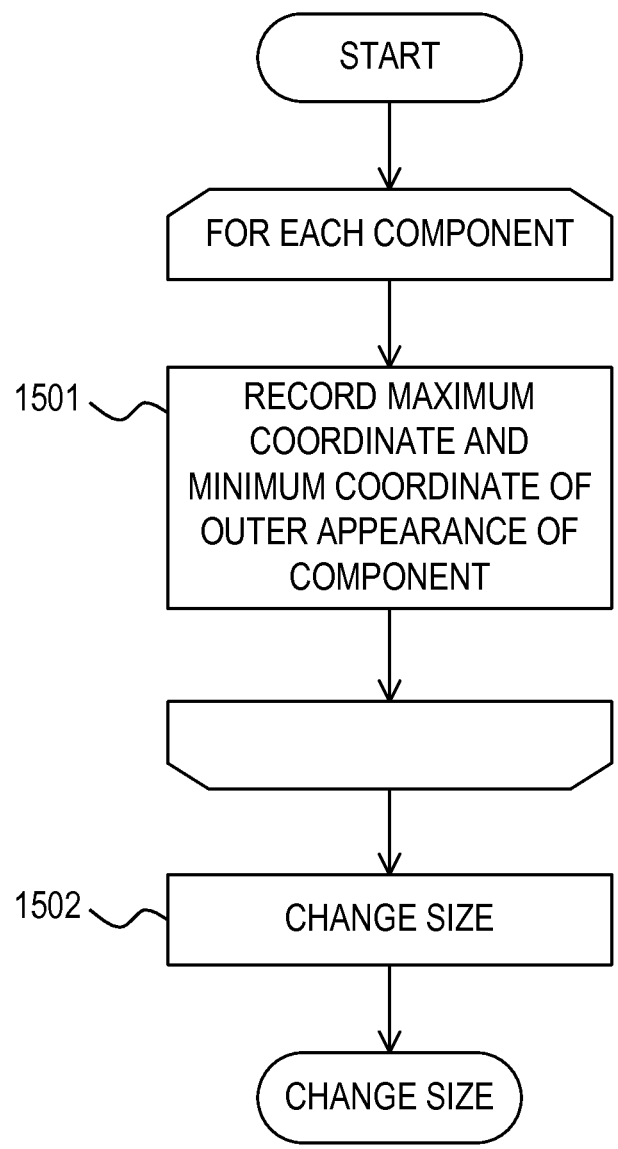
FIG. 15 is a flowchart illustrating window size changing processing.

FIG. 15 is a flowchart illustrating an example of the window size changing processing at 1402 of FIG. 14. First of all, the classification unit 801 obtains, for each component associated with the palette, the maximum values and the minimum values of the coordinates indicating the outer appearance of the component in the substrate coordinate system on the basis of the arrangement coordinates and the shape data included in the component data 1013, and records the obtained values in the storage unit 611 (1501). The processing at 1501 is repeated for all the components associated with the palette.

Next, the classification unit 801 determines a size of an area including the largest coordinate value among the recorded maximum values and the smallest coordinate value among the recorded minimum values as a size of the window (1502). The classification unit 801 changes the size of the window included in the palette data 1018 into the determined size. Accordingly, the size of the window is enlarged or reduced such that all the components associated with the palette are displayed within the window.

Figure 16:
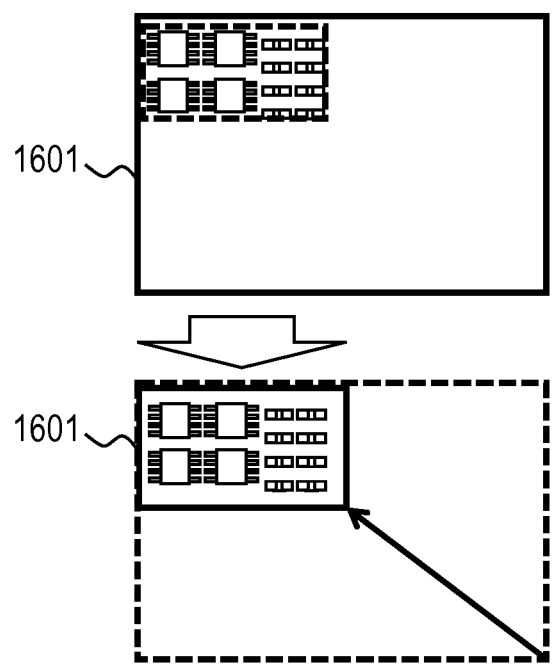
FIG. 16 is a diagram illustrating a window before and after a window size is changed

FIG. 16 is a diagram illustrating an example of a window before and after the window size is changed. In this example, since the size of the window 1601 is larger than the size of the area including the maximum values and the minimum values of the coordinates of a plurality of components, the size of the window 1601 is reduced in conformity with the size of the area. At this time, display magnification of each component within the window 1601 is not changed. According to the window size changing processing, it becomes unnecessary for the operator to perform a work of adjusting the window size.

Figure 17:
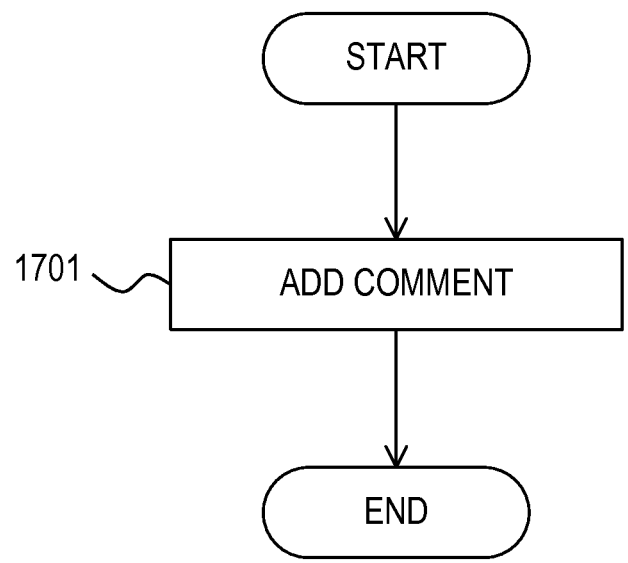
FIG. 17 is a flowchart illustrating comment addition processing.

FIG. 17 is a flowchart illustrating an example of the comment addition processing at 1403 of FIG. 14. The classification unit 801 adds a comment input by the operator to the palette data 1018 of the palette designated by the operator (1701).

Figure 18:
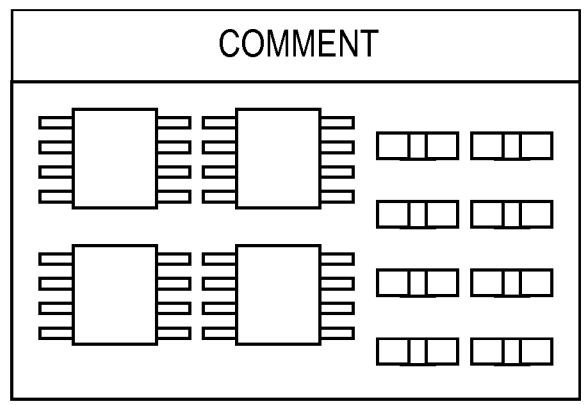
FIG. 18 is a diagram illustrating a window which includes a comment.

FIG. 18 is a diagram illustrating a window which includes a comment. As the comment, for example, an attribute common to the components that belong to the group corresponding to the palette is used. The attribute common to the components may include, for example, a usage and a power supply voltage. Since the comment described above is displayed, the operator may easily discern a plurality of windows displayed on the screen and becomes possible to efficiently select a desired component.

Figure 19:
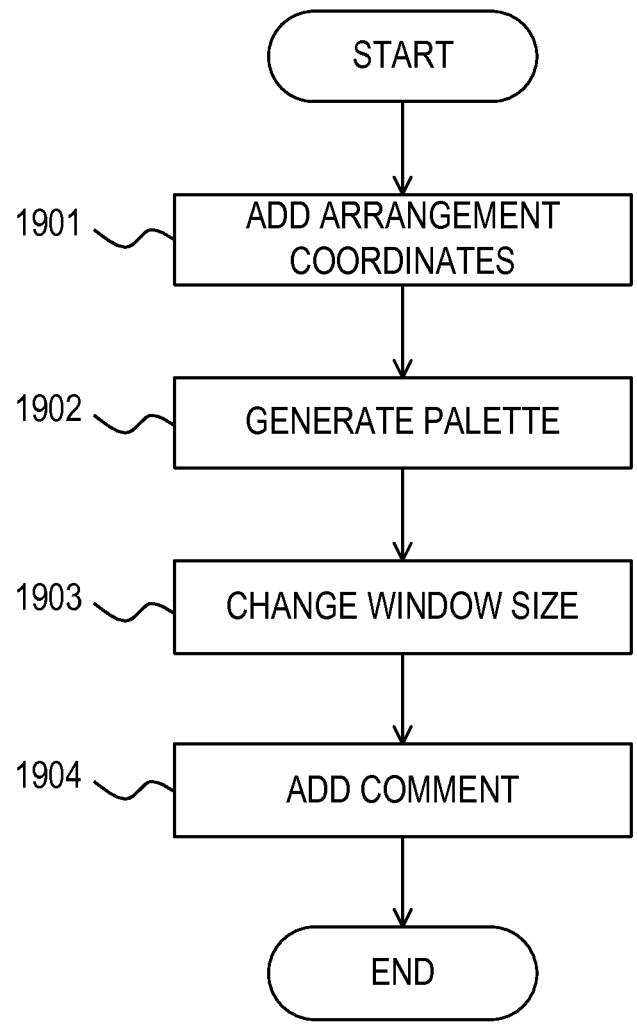
FIG. 19 is a flowchart illustrating a third example of classification processing.

FIG. 19 is a flowchart illustrating a third example of the classification processing at 1201 of FIG. 12. The arrangement positions on the substrate for major components included in the circuit are almost determined in advance. Accordingly, in the third example, the major components are handled as the arranged components and other components are classified on the basis of the relationship between the arranged components and other components.

First of all, the classification unit 801 adds the arrangement coordinates to the component data 1013 of the major components (arranged components) for which the arrangement positions are determined in advance (1901) and performs palette generation processing for each arranged component (1902). The classification unit 801 performs the window size changing processing for each palette (1903) and performs the comment addition processing for each palette (1904). The processing at 1903 and 1904 are the same as those at 1402 and 1403, respectively.

Figure 20:
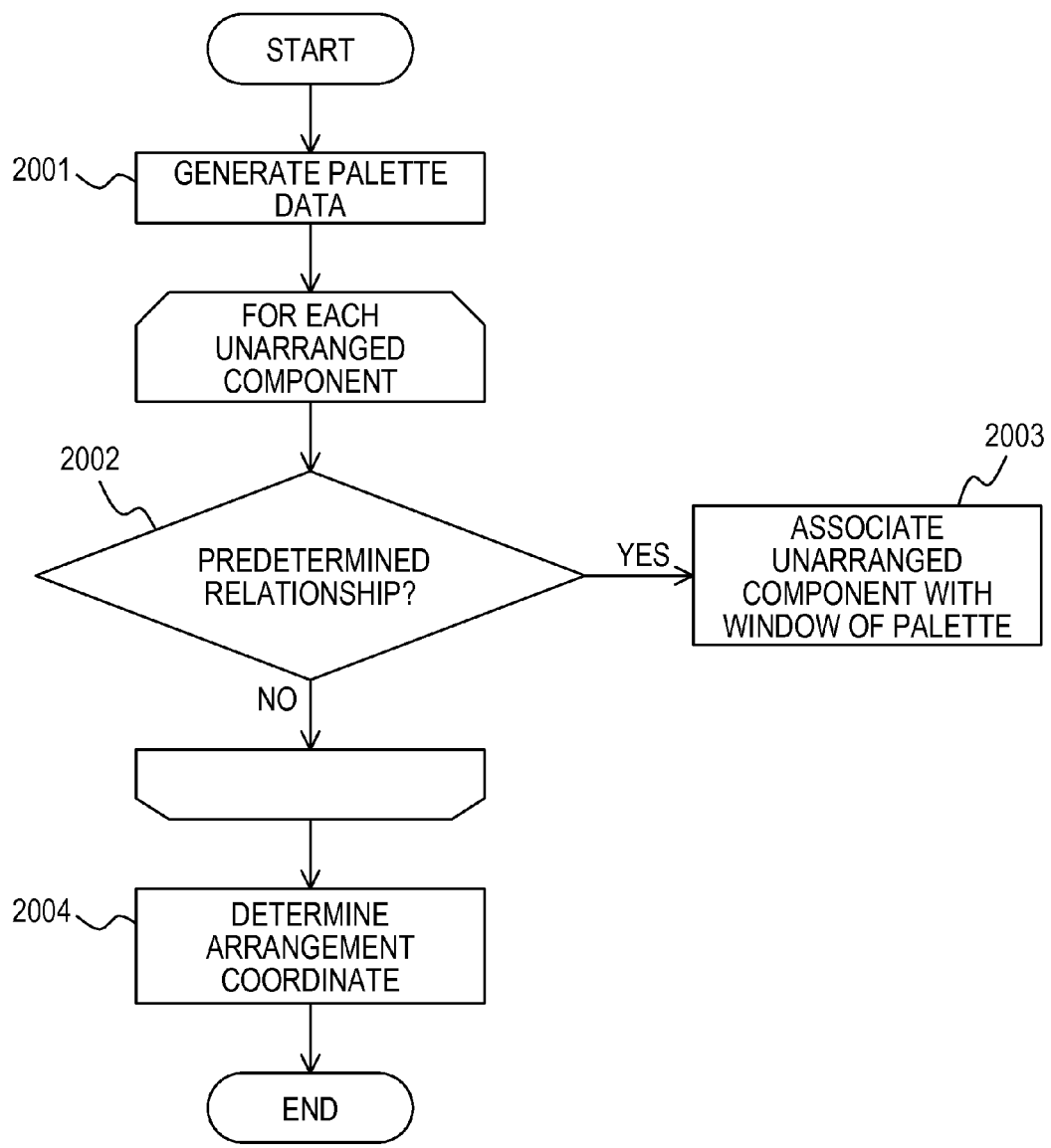
FIG. 20 is a flowchart illustrating palette generation processing.

FIG. 20 is a flowchart illustrating an example of the palette generation processing at 1902 of FIG. 19. First of all, the classification unit 801 generates the palette data 1018 (2001) and determines, for each unarranged component, whether there is a predetermined relationship between the unarranged component and the arranged component (2002).

When it is determined that there is a predetermined relationship between the unarranged component and the arranged component ("YES" at 2002), the classification unit 801 adds the palette ID of the palette data 1018 to the component data 1013 of the unarranged component to associate the unarranged component with the window of the palette (2003). When it is determined that there is no predetermined relationship between the unarranged component and the arranged component ("NO" at 2002), the classification unit 801 does not associate the unarranged component with the window of the palette.

Next, the classification unit 801 determines arrangement coordinates of a plurality of unarranged components to which the same palette ID is added and records the arrangement coordinates in the component data 1013 of the unarranged component (2004). At this time, the classification unit 801 calculates an area of each unarranged component on the basis of the shape data included in the component data 1013. Also, the classification unit 801 uses a gap included in the specification data 1011 as a distance between the components within the window and determines the arrangement coordinates of all the unarranged components such that the plurality of unarranged components are sorted in a descending order of the area.

Figure 21:
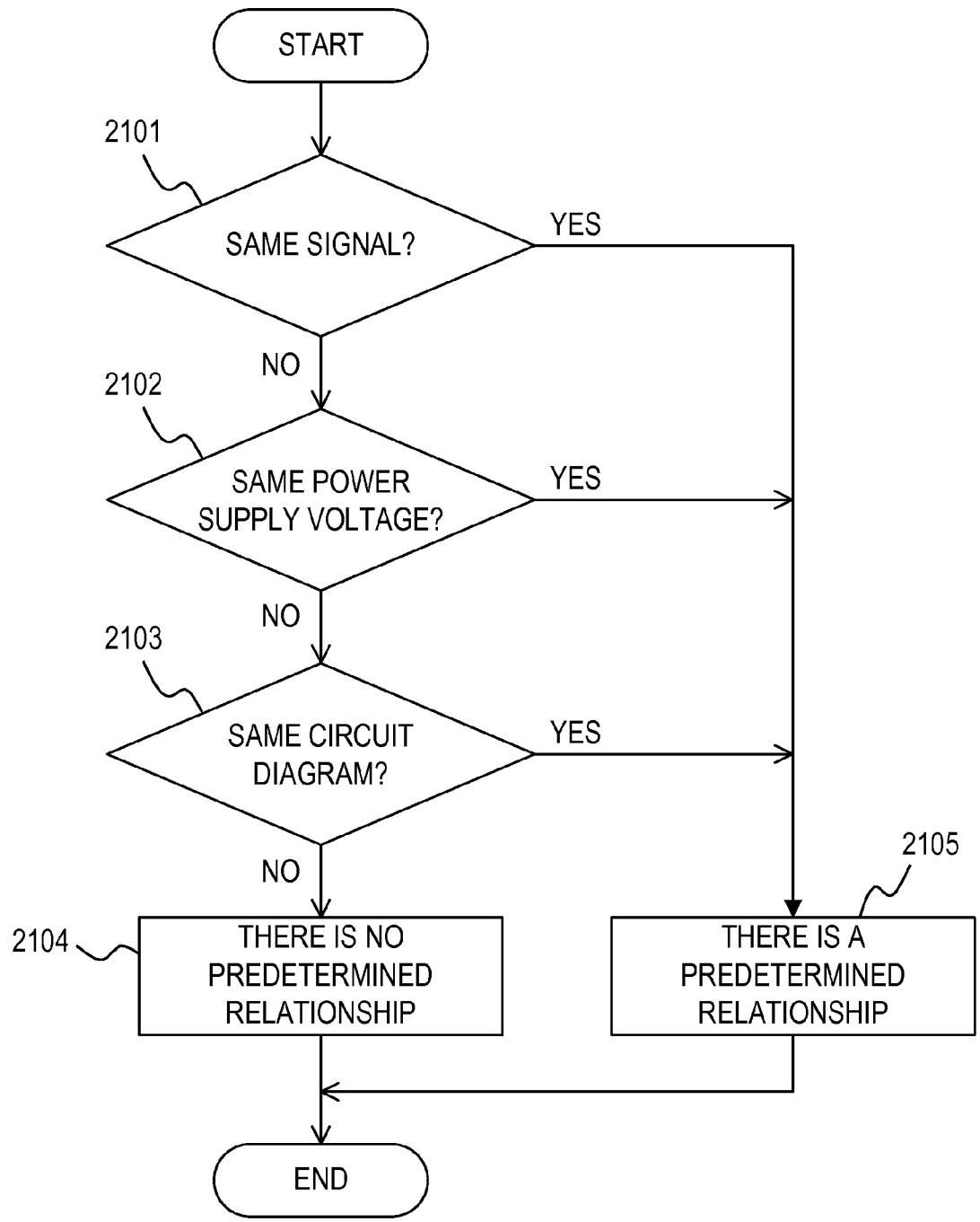
FIG. 21 is a flowchart illustrating determination processing.

FIG. 21 is a flowchart illustrating the determination processing at 2002 of FIG. 20. First of all, the classification unit 801 checks whether the signal of the unarranged component is the same as that of the arranged component (2101).

At this time, the classification unit 801 compares the net IDs of plural pieces of terminal data 1014 including the same component ID as that of the component data 1013 of the unarranged component with the net IDs of plural pieces of terminal data 1014 including the same component ID as that of the component data 1013 of the arranged component. When it is determined that two compared net IDs are the same, the classification unit 801 checks a signal type of the net data 1015 including the net ID. When it is determined that the signal type of the net data 1015 is a signal, the classification unit 801 determines that the signal of the unarranged component is the same as the signal of the arranged component.

In a case where there is no terminal data 1014 including the same net ID or in a case where the signal type of the net data 1015 is not a signal, the classification unit 801 determines that the signal of the unarranged component is not the same as the signal of the arranged component.

When it is determined that the signal of the unarranged component is the same as the signal of the arranged component ("YES" at 2101), the classification unit 801 determines that there is a predetermined relationship between the unarranged component and the arranged component (2105). When it is determined that the signal of the unarranged component is not the same as the signal of the arranged component ("NO" at 2101), the classification unit 801 checks whether a power supply voltage of the unarranged component is the same as a power supply voltage of the arranged component (2102).

At this time, the classification unit 801 compares the net IDs of plural pieces of terminal data 1014 including the same component ID as that of the component data 1013 of the unarranged component with the net IDs of plural pieces of terminal data 1014 including the same component ID as that of the component data 1013 of the arranged component. When it is determined that two compared net IDs are the same, the classification unit 801 checks a signal type of the net data 1015 including the net ID. When it is determined that the signal type of the net data 1015 is a power supply, the classification unit 801 determines that the power supply voltage of the unarranged component is the same as the power supply voltage of the arranged component.

In a case where there is no terminal data 1014 including the same net ID or in a case where the signal type of the net data 1015 is not a power supply, the classification unit 801 determines that the power supply voltage of the unarranged component is not the same as the power supply voltage of the arranged component.

When it is determined that the power supply voltage of the unarranged component is the same as the power supply voltage of the arranged component ("YES" at 2102), the classification unit 801 determines that there is a predetermined relationship between the unarranged component and the arranged component (2105). When it is determined that the power supply voltage of the unarranged component is not the same as the power supply voltage of the arranged component ("NO" at 2102), the classification unit 801 checks whether a circuit diagram of the unarranged component is the same as a circuit diagram of the arranged component (2103).

At this time, the classification unit 801 compares the circuit diagram ID of the component data 1013 of the unarranged component with the circuit diagram ID of the component data 1013 of the arranged component. When the two compared circuit diagram IDs are the same, the classification unit 801 determines that the circuit diagram of the unarranged component is the same as the circuit diagram of the arranged component. When the two compared circuit diagram IDs are different from each other, the classification unit 801 determines that the circuit diagram of the unarranged component is different from the circuit diagram of the arranged component.

When it is determined that the circuit diagram of the unarranged component is the same as the circuit diagram of the arranged component ("YES" at 2103), the classification unit 801 determines that there is a predetermined relationship between the unarranged component and the arranged component (2105). When it is determined that the circuit diagram of the unarranged component is different from the circuit diagram of the arranged component ("NO" at 2103), the classification unit 801 determines that there is no predetermined relationship between the unarranged component and the arranged component (2104).

Figure 22:
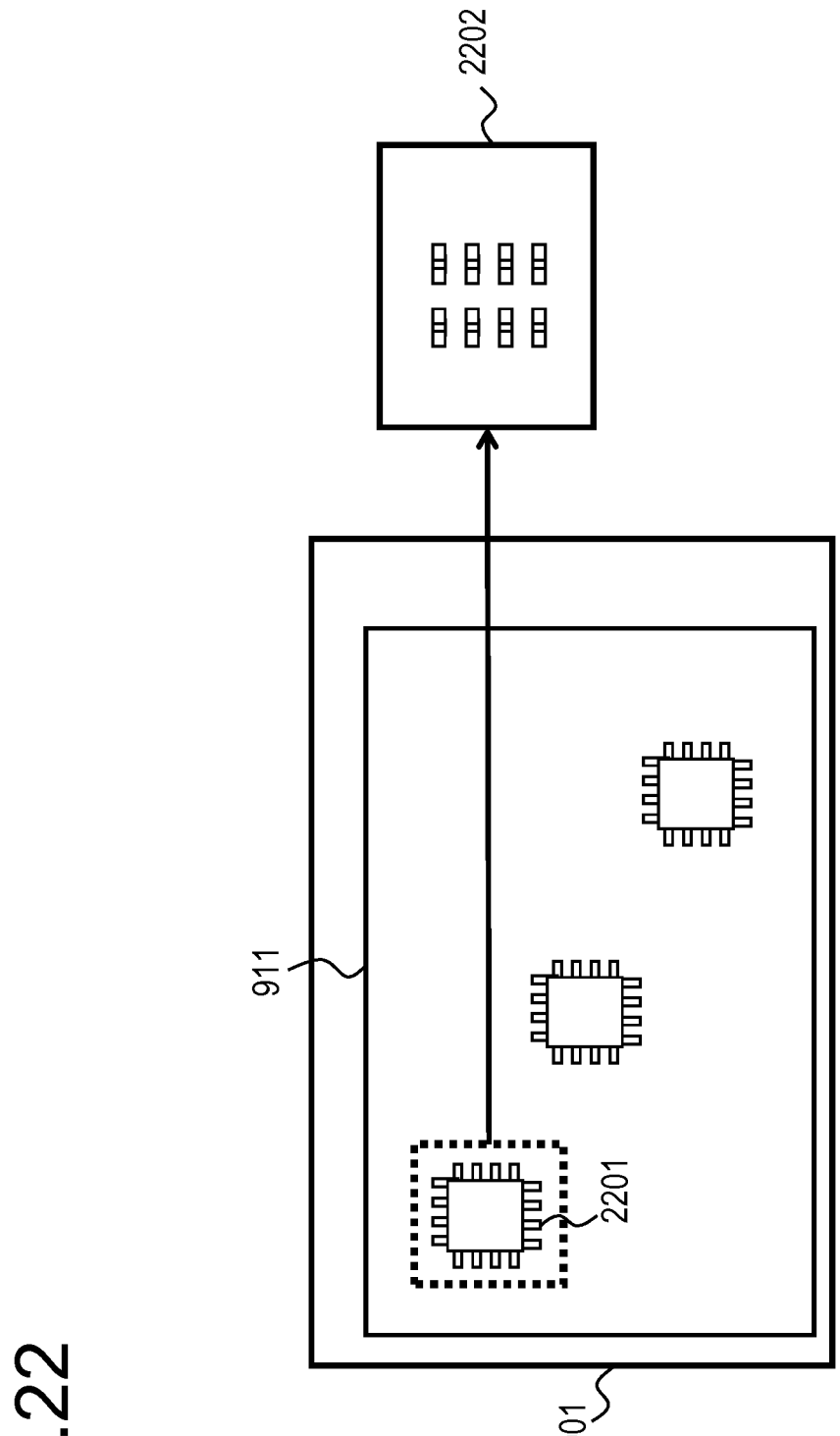
FIG. 22 is a diagram illustrating a predetermined relationship between unarranged components and arranged components.

FIG. 22 is a diagram illustrating an example of a predetermined relationship between an unarranged component and an arranged component. An arranged component 2201 on the substrate 911 is, for example, an LSI and the unarranged component to be associated with a window 2202 is, for example, a capacitor. In this case, since a terminal of the LSI and a terminal of the capacitor belong to the same net and the signal type of the net is a signal, the component data 1013 for the capacitor is associated with the palette data 1018 of the window 2202.

According to the palette generation processing described above, since the unarranged components associated with the arranged components are automatically collected to be stored in the palette, the manual labor of classifying the components by the operator may be eliminated.

Figure 23:
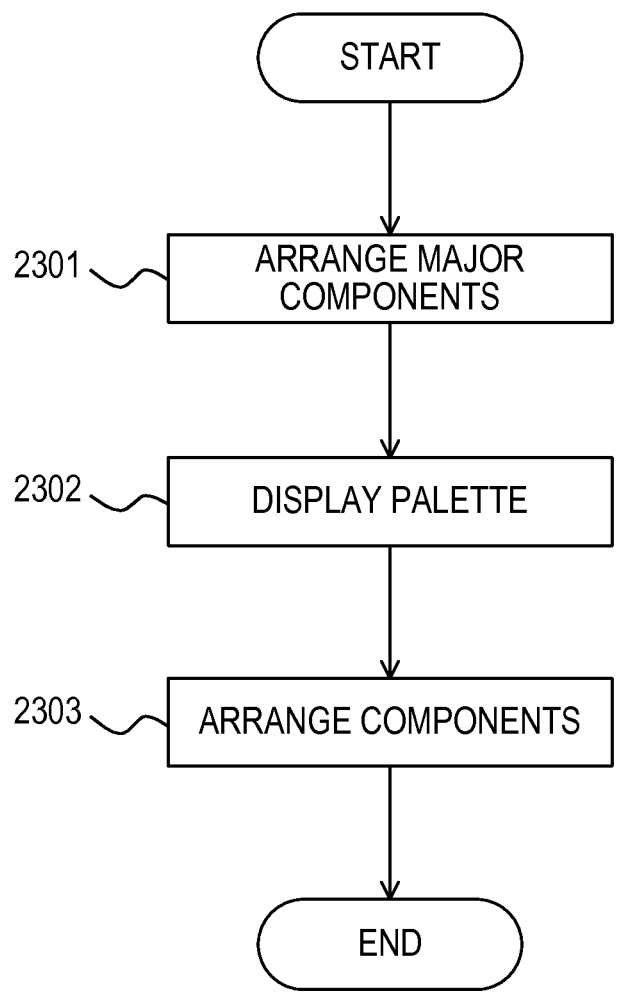
FIG. 23 is a flowchart illustrating a first example of arrangement processing.

FIG. 23 is a flowchart illustrating a first example of the arrangement processing at 1202 of FIG. 12. The arrangement processing is performed when the classification processing of FIG. 19 has been performed. First of all, the generation unit 612 generates display information for displaying the arranged components on the substrate on the basis of the arrangement coordinates included in the component data 1013 of the major components (arranged components) and the display unit 802 displays the substrate and the arranged components on the screen (2301).

Next, the generation unit 612 performs palette display processing (2302) and the operator inputs instructions to arrange, on the substrate, unarranged components displayed within the window of the palette (2303). The generation unit 612 deletes the palette IDs included in the component data 1013 of the components for which the instructions are made on the basis of the input instructions, deletes the shapes of the components from the window, and generates display information for displaying the components on the substrate. The display unit 802 displays the components on the substrate.

Figure 24:
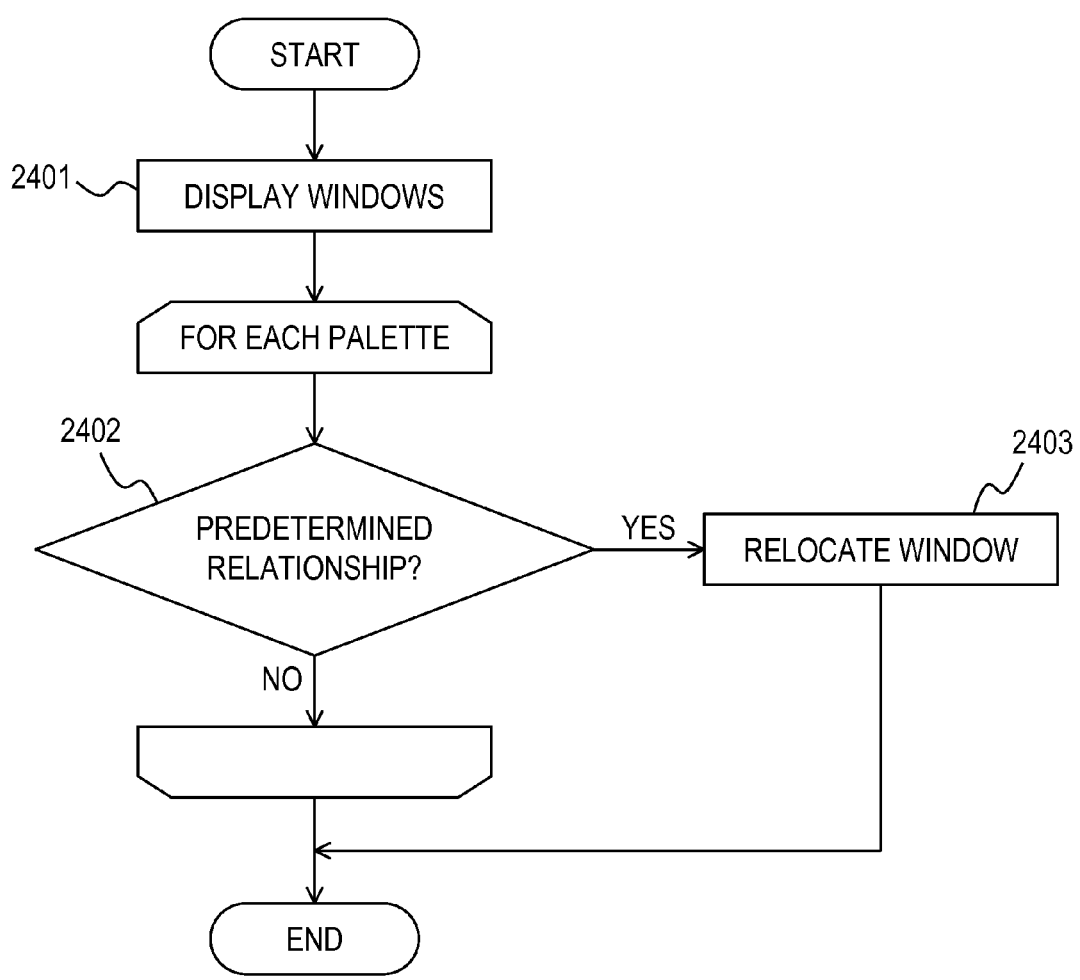
FIG. 24 is a flowchart illustrating palette display processing.

FIG. 24 is a flowchart illustrating an example of the palette display processing at 2302 of FIG. 23. First of all, the generation unit 612 generates display information for displaying the substrate and the palettes, and the display unit 802 displays the window of the substrate and the window of each palette on the screen (2401).

Next, the generation unit 612 determines whether there is a predetermined relationship between unarranged components and the arranged components for each palette (2402). The processing at 2402 is similar to the processing at 2002 of FIG. 20. However, it is determined whether there is a predetermined relationship between each component that belongs to the palette and each arranged component on the substrate at 2402.

When it is determined that there is a predetermined relationship between an unarranged component and an arranged component ("YES" at 2402), the generation unit 612 generates display information which causes the window of the palette to be relocated to the vicinity of the arranged component and the display unit 802 relocates the window to the vicinity of the arranged component (2403). At this time, the generation unit 612 changes the coordinates included in the palette data 1018 into coordinates indicating a position in the vicinity of the arranged component and generates the display information on the basis of the changed coordinates.

As the position in the vicinity of the arranged component, a position closer to the arranged component than the windows of other palettes and placed within a predetermined distance from the arranged component may be adopted.

When it is determined that there is no predetermined relationship between the unarranged components and the arranged components ("NO" at 2402), the generation unit 612 does not generate display information which causes the window of the palette to be relocated.

Figure 25:
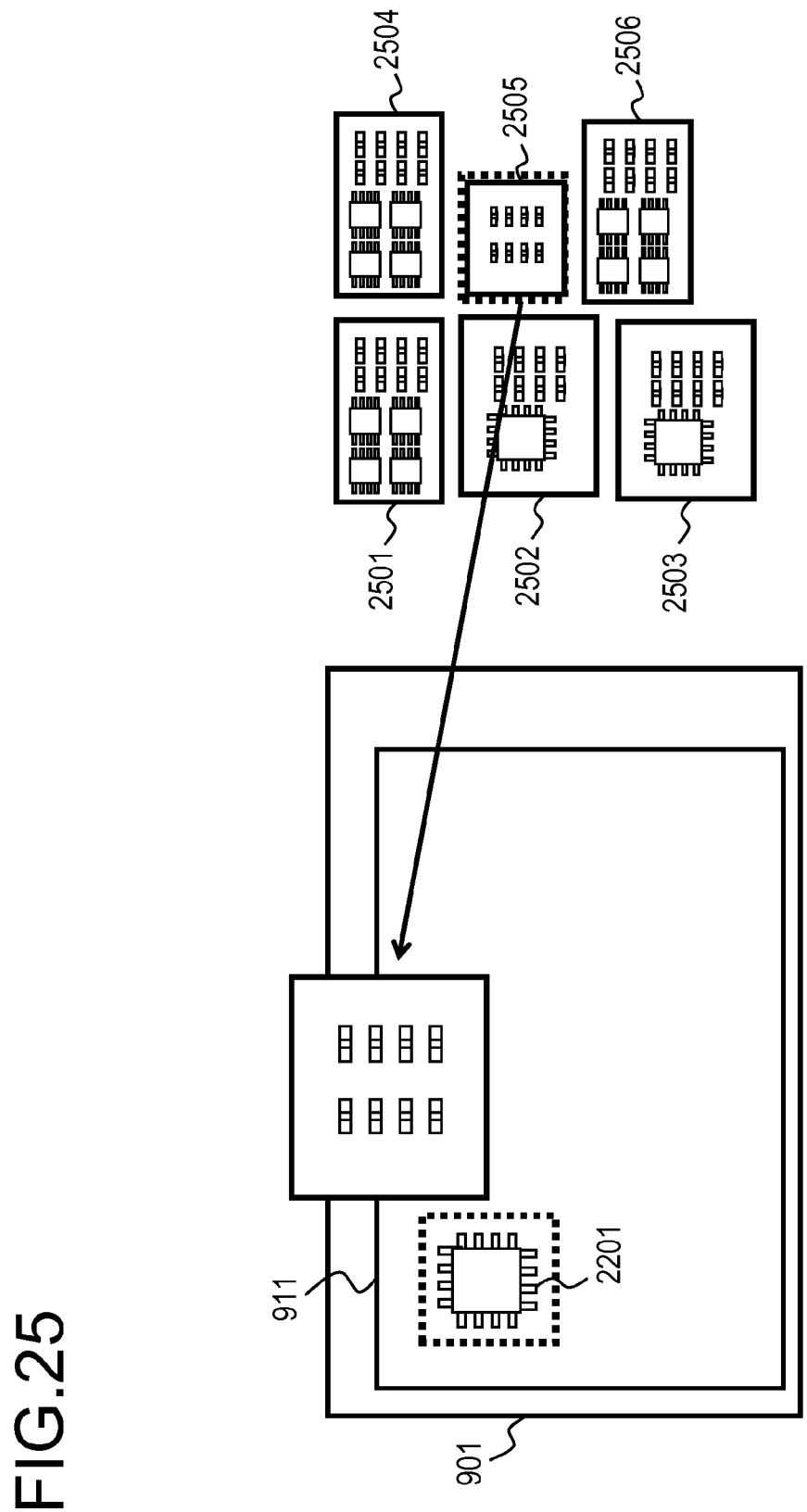
FIG. 25 is a diagram illustrating relocation of a window.

FIG. 25 is a diagram illustrating an example of relocation of a window. When there is a predetermined relationship between the components within a window 2505 among a window 2501 to a window 2506 of the palettes displayed on the screen and the arranged component 2201 on the substrate 911, the window 2505 relocates to the vicinity of the arranged component 2201.

According to the palette display processing described above, the window including a component which is desirably arranged in the vicinity of an arranged component is automatically displayed in the vicinity of the arranged component. Accordingly, the operator may eliminate the effort of finding out the window that includes the component of interest from the windows of a plurality of palettes.

Figure 26:
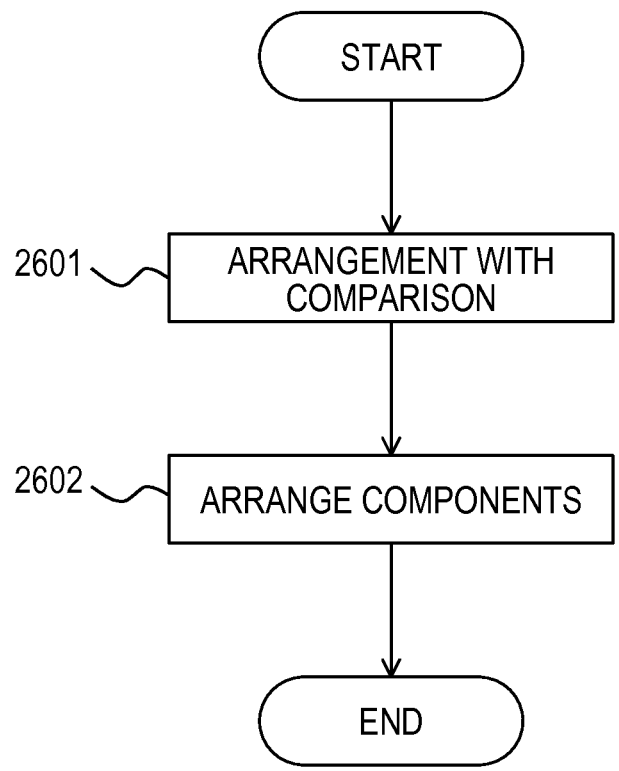
FIG. 26 is a flowchart illustrating a second example of arrangement processing.

FIG. 26 is a flowchart illustrating a second example of the arrangement processing at 1202 of FIG. 12. First of all, the generation unit 612 performs an arrangement-with-comparison processing in which the operator arranges the components while comparing a plurality of component arrangements with each other (2601). Next, the generation unit 612 performs similar processing to the processing at 2303 with respect to the unarranged components other than the components arranged by the arrangement-with-comparison processing (2602).

Figure 27:
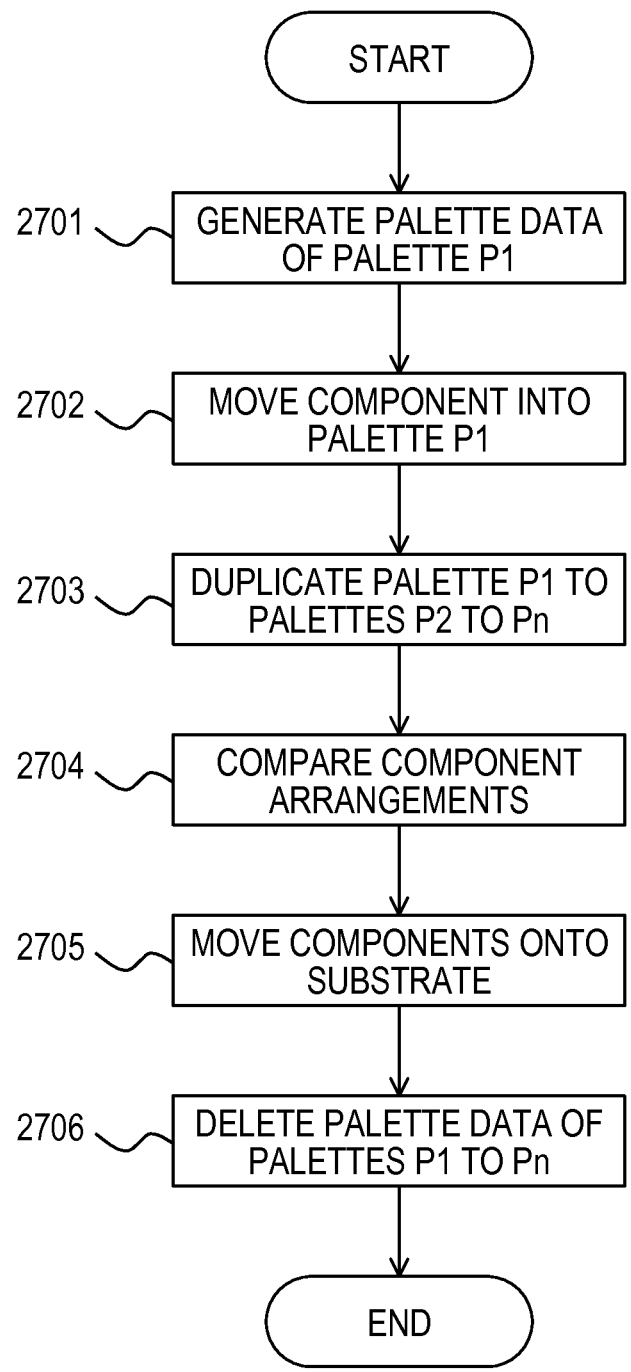
FIG. 27 is a flowchart illustrating arrangement-with-comparison processing.

FIG. 27 is a flowchart illustrating an example of an arrangement-with-comparison processing at 2601 of FIG. 26. First of all, the generation unit 612 generates palette data 1018 of a palette P1 for comparing component arrangements (2701), and the operator selects one or more components to be arranged (2702). The generation unit 612 changes the palette ID included in the component data 1013 of each component selected by the operator into the palette ID of the palette P1 so as to move the component to the palette P1.

The operator instructs the generation unit 612 to duplicate the palette P1, and the generation unit 612, in accordance with the instruction, generates palette data 1018 of palette P2 to palette Pn (n is an integer of two or more) that are duplicates of the palette P1 (2703). The display unit 802 displays n windows of the palette P1 to the palette Pn that include the same components.

The operator conducts n different component arrangements corresponding to n windows while changing the position or direction of the components within each window, and compares and examines the component arrangements between the windows (2704).

Figure 28:
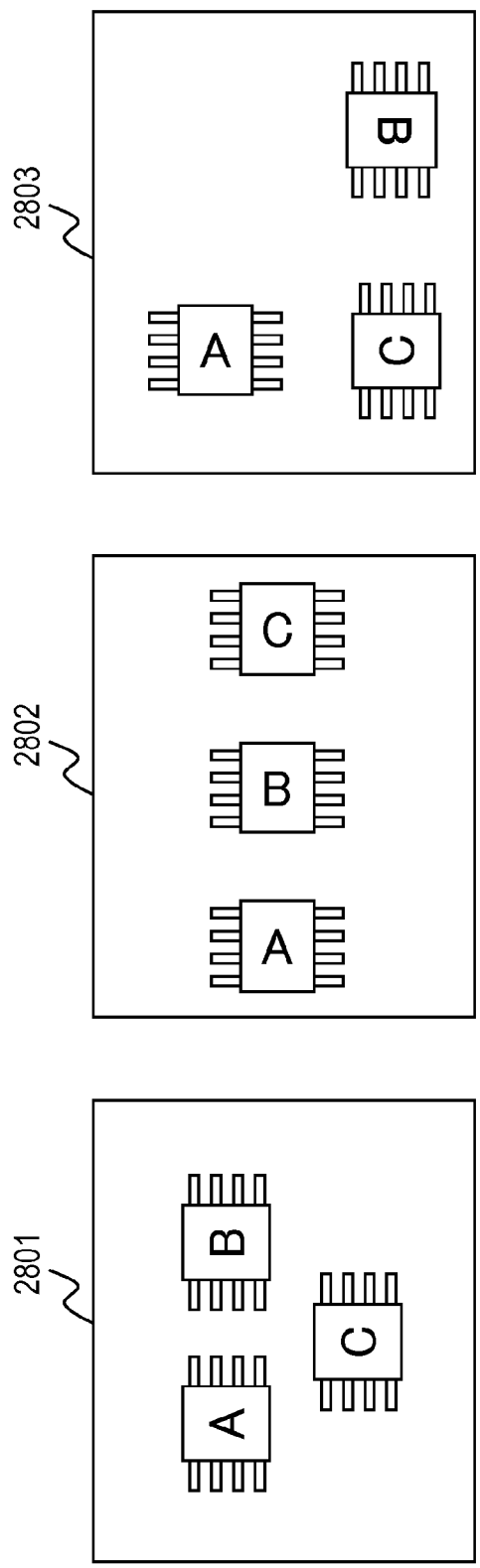
FIG. 28 is a diagram illustrating three windows for displaying component arrangements.

FIG. 28 is a diagram illustrating an example of three windows for displaying three different component arrangements. Palette data 1018 of a window 2802 and a window 2803 is generated by duplicating palette data 1018 of a window 2801, and the component A to the component C are displayed within each of the windows.

The directions of the component A to the component C within the window 2802 are different from the directions of the component A to the component C within the window 2801. The positions of the component B and the component C within the window 2803 are different from the positions of the component B and the component C within the window 2801, and the directions of the component A and the component B within the window 2803 are different from the directions of the component A and the component B within the window 2801.

The operator selects any one component arrangement among the n component arrangements and moves each component from the window corresponding to the selected component arrangement to the substrate in conformity with the selected component arrangement (2705). At this time, the generation unit 612 generates display information for displaying the component on the substrate by deleting the palette ID included in the component data 1013 of the moved component and deleting the shape of the component from the window. The display unit 802 displays the component on the substrate.

The generation unit 612 performs palette deletion processing to delete the palette data 1018 of the palette P1 to the palette PN (2706).

Figure 29:
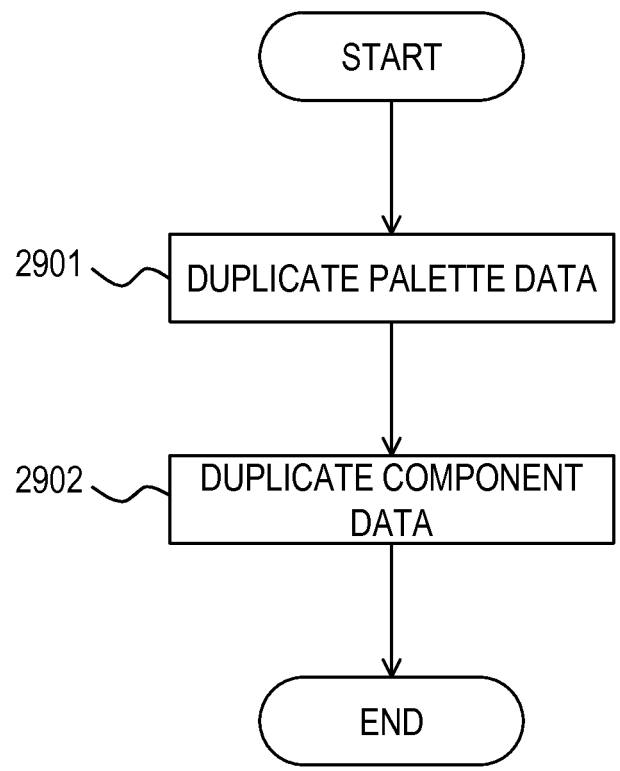
FIG. 29 is a flowchart illustrating palette duplication processing.

FIG. 29 is a flowchart illustrating a palette duplication processing at 2703 of FIG. 29. The palette duplication processing is repeated for the number of times that equals to the number of duplicates of the palette.

First of all, the generation unit 612 generates a duplicate of the palette data 1018 of the palette P1 (2901) and changes the coordinates and the palette ID included in the generated duplicate of the palette data 1018.

Next, the generation unit 612 generates a duplicate of the component data 1013 that includes the palette ID of the palette P1 (2902). The generation unit 612 changes the palette ID included in the generated duplicate of the component data 1013 into the palette ID of the duplicate of the palette data 1018 and changes the arrangement coordinates included in the duplicate of the component data 1013 in conformity with the coordinates of the duplicate of the palette data 1018.

Figure 30:
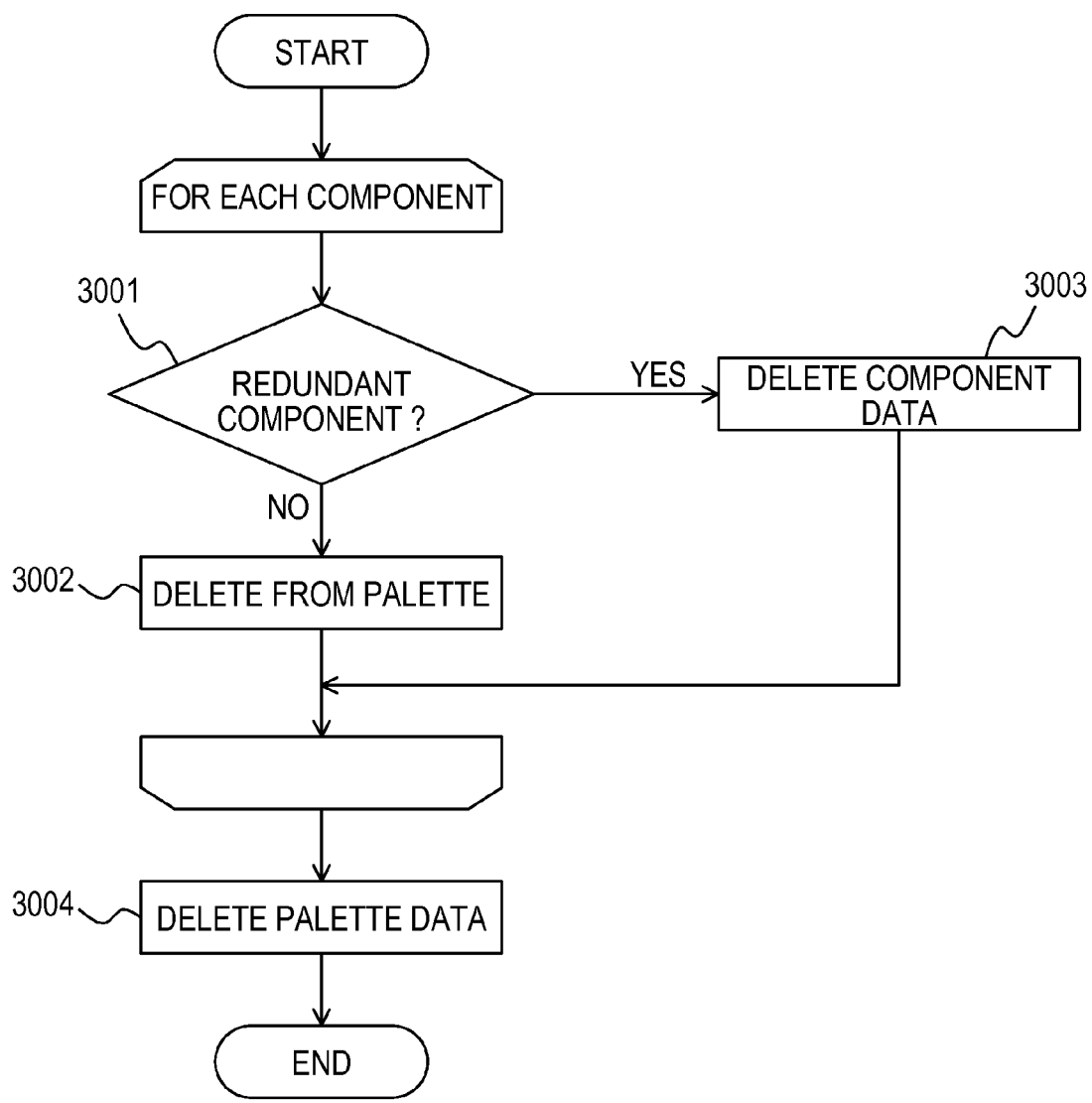
FIG. 30 is a flowchart illustrating palette deletion processing.

FIG. 30 is a flowchart illustrating a palette deletion processing at 2706 of FIG. 27. The palette deletion processing is performed sequentially on each of the palette P1 to the palette Pn.

First of all, the generation unit 612 checks whether a redundant component is present (3001) for each component data 1013 that includes the palette ID of the palette Pj (j=1 to n). Specifically, the generation unit 612 checks whether a separate component data 1013 that includes the component ID of the component data 1013 of interest is present in the storage unit 611. The redundant component indicated by the separate component data 1013 that includes the same component ID as the component data 1013 of interest may be in a state of having been arranged on the substrate and remained in the window of another palette.

When the separate component data 1013 that includes the same component ID is present, it is determined that the redundant component is present. When the separate component data 1013 that includes the same component ID is not present, it is determined that the redundant component is not present.

When it is determined that the redundant component is present ("YES" at 3001), the generation unit 612 deletes the component data 1013 of interest (3003). When it is determined that the redundant component is not present ("NO" at 3001), the generation unit 612 determines that the component indicated by the component data 1013 of interest is an unarranged component and deletes the palette ID included in the component data 1013 of interest (3002).

Next, the generation unit 612 deletes the palette data 1018 of the palette Pj (3004). In a case where all the components that belong to the palette Pj are arranged on the substrate and the component data 1013 including the palette ID of the palette Pj is not present, the generation unit 612 skips the processing at 3001, 3002, and 3003, and deletes the palette data 1018 of the palette Pj (3004).

According to the arrangement-with-comparison processing described above, since a plurality of different component arrangements for the same components may be listed on the screen to be compared with each other, the operator may efficiently examine the component arrangements and easily obtains a high quality arrangement result.

At 1103 of FIG. 11, the classification unit 801 may perform similar classification processing as the classification processing of FIG. 13 so as to generate a palette for vias and lines. In this case, the classification unit 801 classifies the vias and the lines into a plurality of groups in accordance with instructions from the operator and generates palette data 1018 for each group. Next, the classification unit 801 adds the palette ID of the palette data 1018 to the via data 1016 of the vias that belong to each group and to the line data 1017 of the lines that belong to each group so as to associate the vias and the lines with the window of the palette.

The operator arranges, on the substrate in which the components are arranged, the vias and the lines within a window displayed on the basis of the palette data 1018.

The configuration of the information processing apparatus 601 of FIG. 6 and FIG. 8 is illustrative only and some constitutional elements thereof may be omitted or changed depending on a usage or a condition of the information processing apparatus 601. For example, in a case where the unarranged components are classified into a plurality of groups in advance, the classification unit 801 of FIG. 8 may be omitted. In a case where the display information generated by the generation unit 612 is to be output to the communication network, the display unit 802 of FIG. 8 may be changed into the network connection device.

The flowcharts illustrated in FIG. 7, FIG. 11, FIG. 12, FIG. 13, FIG. 14, FIG. 15, FIG. 17, FIG. 19, FIG. 20, FIG. 21, FIG. 23, FIG. 24, FIG. 26, FIG. 27, FIG. 29, and FIG. 30 are illustrative only and some processing thereof may be omitted or changed depending on a usage or a condition of the information processing apparatus 601. For example, in a case where the information processing apparatus 601 is used only for the arrangement design, the processing at 1101, 1103, and 1104 of FIG. 11 may be omitted.

In a case where the unarranged components are classified into a plurality of groups in advance, the processing at 1201 of FIG. 12 may be omitted. When it is unnecessary to change the window size of the palette, the processing at 1402 of FIG. 14 and the processing at 1903 of FIG. 19 may be omitted. When it is unnecessary to add the comment to the palette, the processing at 1403 and the processing at 1904 may be omitted.

At 2004 of FIG. 20, the classification unit 801 may determine the arrangement coordinates of the unarranged components such that a plurality of unarranged components are arranged in an order other than a descending order of the area. The classification unit 801 may omit a single or two processing among the processing at 2101, 2102, and 2103 of FIG. 21 and determine, using a method other than the determination processing of FIG. 21, whether there is a predetermined relationship between an unarranged component and an arranged component.

When it is unnecessary to relocate a window of a palette to the vicinity of the arranged component, the processing at 2302 of FIG. 23 may be omitted. When the operator does not need to compare a plurality of component arrangements with each other, the processing at 2601 of FIG. 26 may be omitted.

The shapes of a substrate and components illustrated in FIG. 1, FIG. 2, FIG. 3, FIG. 4, FIG. 5, FIG. 9, FIG. 16, FIG. 18, FIG. 22, FIG. 25, and FIG. 28 are illustrative only, and the arrangement design may be performed using a substrate or components having other shapes.

The CAD data 1001 illustrated in FIG. 10 is illustrative only, and a portion of data may be omitted or changed depending on a usage or a condition of the information processing apparatus 601. For example, in a case where the information processing apparatus 601 is used only for the arrangement design, the via data 1016 and the line data 1017 may be omitted.

The semiconductor substrate (wafer) may be used as the substrate indicated by the substrate data 1012 instead of the printed circuit board. In this case, for example, a circuit block arranged on the semiconductor substrate may be used as the component indicated by the component data 1013.

Figure 31:
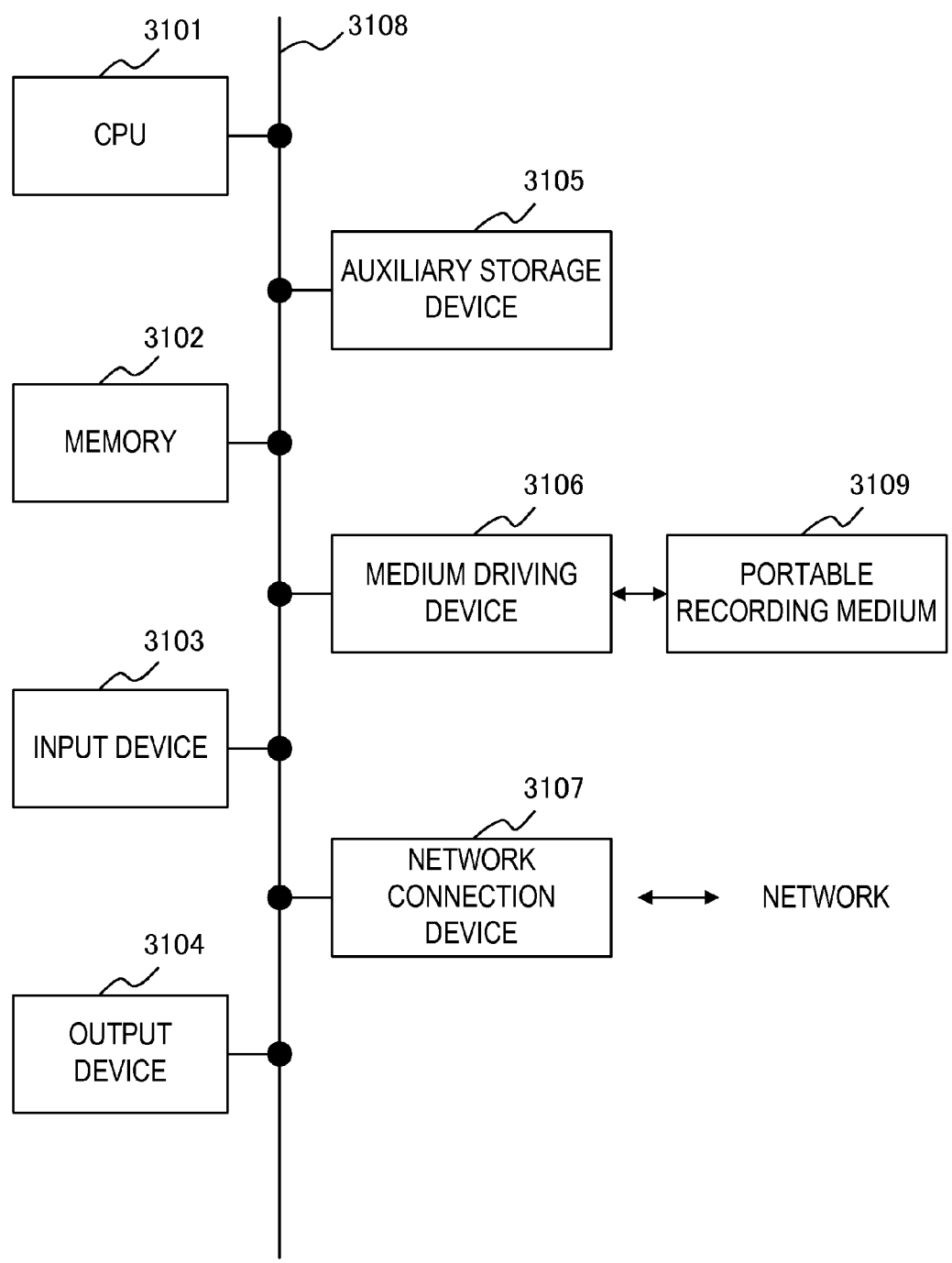
FIG. 31 is a diagram illustrating a hardware configuration of an information processing apparatus.

FIG. 31 is a diagram illustrating a hardware configuration of the information processing apparatus 601 of FIG. 6 and FIG. 8. The information processing apparatus of FIG. 31 includes a central processing unit (CPU) 3101, a memory 3102, an input device 3103, an output device 3104, an auxiliary storage device 3105, a medium driving device 3106, and a network connection device 3107. These constitutional elements are connected with each other through a bus 3108.

The memory 3102 is a semiconductor memory such as, a read-only memory (ROM), a random access memory (RAM), and a flash memory, and stores therein a design support program and data used in the design support processing. The memory 3102 may be used as a storage unit 611.

The CPU 3101 (processor) operates as the generation unit 612 and the classification unit 801 of FIG. 6 and FIG. 8 by executing the design support program using, for example, the memory 3102, and performs the design support processing.

The input device 3103 may be, for example, a keyboard and a pointing device, and is used for inputting an instruction or information by the operator. The output device 3104 may be, for example, a display device, a printer, and a speaker, and is used for an inquiry to the operator or outputting the processing result. The processing result of the design support processing includes display information for displaying, for example, the window. The output device 3104 may be used as the output unit 613 of FIG. 6 or the display unit 802 of FIG. 8.

The auxiliary storage device 3105 may be, for example, a magnetic disk device, an optical disk device, an opto-magnetic disk device, and a tape device. The auxiliary storage device 3105 may be a hard disk drive. The information processing apparatus may store the design support program and data in the auxiliary storage device 3105, and may use the design support program and data by loading them onto the memory 3102. The auxiliary storage device 310 may be used as the storage unit 611.

The medium driving device 3106 drives a portable recording medium 3109 and accesses the recorded contents thereof. The portable recording medium 3109 may be, for example, a memory device, a flexible disk, an optical disk, or an opto-magnetic disk. The portable recording medium 3109 may be, for example, a compact disk read-only memory (CD-ROM), a digital versatile disk (DVD), and a universal serial bus (USB) memory. The operator may store the design support program and data in the portable recording medium 3109 and use the design support program and data by loading them onto the memory 3102.

As described above, the computer-readable recording medium which stores the design support program and data is a physical (non-transitory) recording medium such as the memory 3102, the auxiliary storage device 3105, or the portable recording medium 3109.

The network connection device 3107 is connected to a communication network such as a local area network (LAN) and the Internet, and serves as a communication interface performing a data conversion accompanying the communications. The information processing apparatus may receive the design support program and data from an external apparatus through the network connection device 3107, and may use the design support program and data by loading then onto the memory 3102.

Further, the information processing apparatus may receive a processing request from an operator terminal through the network connection device 3107 and transmit a processing result to the operator terminal. In this case, the network connection device 3107 is used as the output unit 613 of FIG. 6 and outputs the processing result to the communication network. The operator terminal receives the processing result from the communication network and displays the received processing result on the screen of the display device.

The information processing apparatus does not need to include all the constitutional elements of FIG. 31 and some of the constitutional elements may be omitted depending on a usage or a condition. For example, when the information processing apparatus receives a processing request from an operator terminal via the communication network, the input device 3103 and the output device 3104 may be omitted. When the information processing apparatus does not intend to access the portable recording medium 3109, the medium driving device 3106 may be omitted. When the information processing apparatus is not connected to the communication network, the network connection device 3107 may be omitted.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:
1. A non-transitory computer-readable recording medium having stored therein a program that causes a computer to execute a process, the process comprising:
  referencing a storage unit configured to store therein plural pieces of shape data indicating shapes of a plurality of components, the plural pieces of shape data being associated with a first window for displaying unarranged components of the plurality of components;
  generating, using the plural pieces of shape data, display information for displaying a shape of a substrate on a screen, the substrate including at least one location on the substrate for adding a component from the unar- ranged components, and for displaying the first window including the shapes of the plurality of components on the displayed substrate;

outputting the display information;

updating, upon receiving an instruction to move a first component of the plurality of components from the first window to the at least one location on the substrate, the display information such that a shape of the first component is deleted from the first window and added on the substrate; and outputting the updated display information.

2. The non-transitory computer-readable recording medium according to claim 1, the process further comprising:

associating, in the storage unit, the plural pieces of shape data with the first window in a case where there is a predetermined relationship between the plurality of components and an arranged component arranged on the substrate.

3. The non-transitory computer-readable recording medium according to claim 2, the process further comprising:

updating the updated display information as second updated display information such that the first window is relocated to a position within a predetermined distance from the arranged component on the screen; and outputting the second updated display information.

4. The non-transitory computer-readable recording medium according to claim 1, wherein the storage unit is configured to store coordinates of the plurality of components, and the process is further comprising:

determining, on basis of the coordinates of the plurality of components, a size of the first window such that the shapes of the plurality of components are displayed within the first window.

5. The non-transitory computer-readable recording medium according to claim 1, the process further comprising:

updating the updated display information as third updated display information such that a second window is displayed on the screen, the second window including the shapes of the plurality of components; and outputting the third updated display information, wherein a position or a direction of a first component of the plurality of components within the second window is different from a position or a direction of the first component within the first window.

6. A design support method, comprising:

referencing, by a computer, a storage unit configured to store therein plural pieces of shape data indicating shapes of a plurality of components, the plural pieces of shape data being associated with a first window for displaying unarranged components of the plurality of components;

generating, using the plural pieces of shape data, display information for displaying a shape of a substrate on a screen, the substrate including at least one location on the substrate for adding a component from the unarranged components, and for displaying the first window including the shapes of the plurality of components on the displayed substrate;

outputting the display information;

updating, upon receiving an instruction to move a first component of the plurality of components from the first window to the at least one location on the substrate, the display information such that a shape of the first component is deleted from the first window and added on the substrate; and outputting the updated display information.

7. The design support method according to claim 6, further comprising:

associating, in the storage unit, the plural pieces of shape data with the first window in a case where there is a predetermined relationship between the plurality of components and an arranged component arranged on the substrate.

8. The design support method according to claim 7, further comprising:

updating the updated display information as second updated display information such that the first window is relocated to a position within a predetermined distance from the arranged component on the screen; and outputting the second updated display information.

9. An information processing apparatus, comprising:

a memory configured to store therein plural pieces of shape data indicating shapes of a plurality of components, the plural pieces of shape data being associated with a first window for displaying unarranged components of the plurality of components; and a processor coupled to the memory and the processor configured to generate, using the plural pieces of shape data stored in the storage unit, display information for displaying a shape of a substrate on a screen, the substrate including at least one location on the substrate for adding a component from the unarranged components, and for displaying the first window including the shapes of the plurality of components on the displayed substrate, output the display information;

updating, upon receiving an instruction to move a first component of the plurality of components from the first window to the at least one location on the substrate, the display information such that a shape of the first component is deleted from the first window and added on the substrate; and outputting the updated display information.

10. The information processing apparatus according to claim 9, wherein the processor is further configured to associate, in the storage unit, the plural pieces of shape data with the first window in a case where there is a predetermined relationship between the plurality of components and an arranged component arranged on the substrate.

11. The information processing apparatus according to claim 10, wherein the processor is further configured to updating the updated display information as second updated display information such that the first window is relocated to a position within a predetermined distance from the arranged component on the screen; and outputting the second updated display information.

* * * * *